(12) United States Patent
Hill

(10) Patent No.: US 7,122,842 B2
(45) Date of Patent: Oct. 17, 2006

(54) SOLID STATE WHITE LIGHT EMITTER AND DISPLAY USING SAME

(75) Inventor: Steven E. Hill, Castle Rock, CO (US)

(73) Assignee: Group IV Semiconductor Inc., Ottawa (CA)

( * ) Notice: Subject to any disclaimer, the term of this patent is extended or adjusted under 35 U.S.C. 154(b) by 0 days.

(21) Appl. No.: 10/896,069

(22) Filed: Jul. 22, 2004

(65) Prior Publication Data

US 2005/0051777 A1    Mar. 10, 2005

Related U.S. Application Data

(60) Provisional application No. 60/500,686, filed on Sep. 8, 2003.

(51) Int. Cl.
*H01L 27/15* (2006.01)
(52) U.S. Cl. .......................... 257/86; 257/99; 257/101; 257/103
(58) Field of Classification Search ............... None
See application file for complete search history.

(56) References Cited

U.S. PATENT DOCUMENTS

| | | | |
|---|---|---|---|
| 4,967,251 A * | 10/1990 | Tanaka et al. ............... 257/78 |
| 5,422,907 A | 6/1995 | Bhargava | |
| 5,434,878 A | 7/1995 | Lawandy | |
| 5,607,876 A * | 3/1997 | Biegelsen et al. ........... 438/45 |
| 5,637,258 A | 6/1997 | Goldburt et al. | |
| 5,667,905 A | 9/1997 | Campisano et al. | |
| 6,255,669 B1 | 7/2001 | Birkhahn et al. | |
| 6,294,401 B1 | 9/2001 | Jacobson et al. | |
| 6,614,824 B1 * | 9/2003 | Tsuda et al. ............. 372/46.01 |
| 6,881,977 B1 * | 4/2005 | Lin ............................ 257/79 |
| 2002/0017657 A1 | 2/2002 | Coffa et al. | |
| 2002/0048289 A1 | 4/2002 | Atanackovic et al. | |
| 2002/0070121 A1 | 6/2002 | Nayfeh et al. | |
| 2002/0074565 A1 | 6/2002 | Flagan et al. | |
| 2002/0163003 A1 | 8/2002 | Dal Negro et al. | |
| 2003/0034486 A1 | 2/2003 | Korgel | |
| 2004/0183087 A1 | 9/2004 | Gardner | |
| 2004/0252738 A1 * | 12/2004 | Hill ............................ 372/43 |

FOREIGN PATENT DOCUMENTS

| DE | 101 04 193 | 8/2002 |
|---|---|---|
| DE | WO 02/061815 | 8/2002 |

(Continued)

OTHER PUBLICATIONS

Fuji, M. et al., 1.54 µm Photoluminescence of $Er^{3+}$ Doped Into $SiO_2$ Films Containing Si Nanocrystals: Evidence for Energy Transfer From Si Nanocrystals to $Er^{3+}$. *Applied Physics Letters*, American Institute of Physics vol. 71, Sep. 1, 1997. New York, NY United States of America. pp. 1198-1200. ISSN: 0003-6951.

(Continued)

*Primary Examiner*—Wai-Sing Louie
(74) *Attorney, Agent, or Firm*—Allen, Dyer, Doppelt, Milbrath & Gilchrist, P.A.

(57) ABSTRACT

A light emitting assembly comprising a solid state device coupleable with a power supply constructed and arranged to power the solid state device to emit from the solid state device. A series of rare-earth doped silicon and/or silicon carbide nanocrystals that are either combined in a single layer or in individual layers that produce the required Red, Green, and Blue (RGB) emission to form a white light.

35 Claims, 8 Drawing Sheets

FOREIGN PATENT DOCUMENTS

| EP | 0 650 200 | 4/1995 |
|----|-----------|--------|
| EP | 1 134 799 | 9/2001 |
| JP | 2001 203382 | 7/2001 |
| WO | 2061815 | 8/2002 |

OTHER PUBLICATIONS

Orlov, L.K. et al., Comparitive Analysis of Light Emmiting Properties of Si:Er and Ge/Si$_{1-x}$Ge$_x$ Epitaxial Structures Obtained by MBE Method. *Gettering and Defect Engineering in Semiconductor Technology, Solid State Phenomena (FORMERLY Part B of Diffusion and Defect Data [0377-6883])*. vol. 69 unit 70, 1999, pp. 377-382. ISSN:1012-0394.

Shin, J.H. et al., Controlling the Quantum Effects and Erbium-Carrier Interaction Using Si/SiO$_2$ Superlattices. *Proceedings of the SPIE*. vol. 4282, Jan. 1, 2001. Bellingham, VA United States of America, pp. 142-152.

Yun, F. et al., Room Temperature Single-Electron Narrow-Channel Memory with Siliconnanodots Embedded in SiO$_2$ Matrix. *Japanese Journal of Applied Physics*. Publication Office Japanese Journal of Applied Physics. vol. 39, No. 8A Part II. Aug. 1, 2000. Tokyo, Japan. pp. L792-L795.

Giorgia Franzó, et al, Er$^{3+}$Ions—Si Nanocrystals Interactions and Their Effects on the Luminescence Properties; Applied Physics Letters, vol. 76, No. 16, Apr. 17, 2000, pp. 2167-2169.

Se-Young Seo, and Jung H. Shin, Exciton-Erbium Coupling and the Excitation Dynamics of Er$^{3+}$in Erbium-Doped Silicon-Rich Silicon Oxide; Applied Physics Letters, vol. 78, No. 18, Apr. 30, 2001, pp. 2709-2711.

Jung H. Shin, et al., Photoluminescence Excitation Spectroscopy of Erbium-Doped Silicon-Rich Silicon Oxide; Applied Physics Letters, vol. 76, No. 15, Apr. 10, 2000, pp. 1999-2001.

F. Iacona, et al., Electroluminescence at 1.54 μm in Er-Doped Si Nanocluster-Based Devices; Applied Physics Letters, vol. 81, No. 17, Oct. 21, 2002, pp. 3242-3244.

Minoru Fujii, et al., Photoluminescence from SiO$_2$ Films Containing Si Nanocrystals and Er: Effects of Nanocrystalline Size on the Photoluminescence Efficiency of Er$^{3+}$; Journal of Applied Physics, vol. 84, No. 8, Oct. 15, 1998, pp. 4525-4531.

A.J. Kenyon, et al., Luminescence from Erbium-Doped Silicon Nanocrystals in Silica: Excitation Mechanisms; Journal of Applied Physics, vol. 91, No. 1, Jan. 1, 2002, pp. 367-374.

J. De la Torre, et al., Optical and Electrical Transport Mechanisms in Si-Nanocrystal-Based LEDs; Elsevier Science B.V., Physica E, 2002, pp. 1-3.

Jung H. Shin, et al., Composition Dependence of Room Temperature 1.54 μm Er$^{3+}$Luminescence from Erbium-Doped Silicon: Oxygen Thin Films Deposited by Electron Cyclotron Resonance Plasma Enhanced Chemical Vapor Deposition; Applied Physics Letters, vol. 72, No. 9, Mar. 2, 1998, pp. 1092-1094.

P.G. Kik, et al., Strong Exciton-Erbium Coupling in Si Nanocrystal-Doped SiO$_2$; Applied Physics Lettters, vol. 76, No. 17, Apr. 24, 2000, pp. 2325-2327.

G. Franzó, et al., Electroluminescence of Silicon Nanocrystals in MOS Structures; Appl. Phys. A, Materials Science & Processing, 74, (2002), pp. 1-5.

A. Irrera, et al., Excitation and De-Excitation Properties of Silicon Quantrum Dots Under Electrical Pumping; Applied Physics Letters, vol. 81, No. 10, Sep. 2, 2002, pp. 1866-1868.

P.S. Andry, et al., Growth of Er-Doped Silicon Using Metalorganics by Plasma-Enhanced Chemical Vapor Deposition; J. Appl. Phys. 80 (I), Jul. 1, 1996, pp. 551-558.

Kei Watanabe, et al., Resonant Excitation of Er$^{3+}$ By the Energy Transfer from Si Nanocrystals; Journal of Applied Physics, vol. 90, No. 9, Nov. 1, 2001, pp. 4761-4767.

J. De la Torre, et al., Optical Properties of Silicon Nanocrystal LEDs; Elsevier Science B.V., Physica E, 2002, pp. 326-330.

A. Nakajima, et al. Microsctructure and Optical Absorption Properties OS Si Nanocrystals Fabricated with Low-Pressure Chemical-Vapor Deposition; J. Appl. Phys., vol. 80, No. 7, Oct. 1, 1996, pp. 4006-4011.

Jeong Sook Ha, et al., Er$^{3+}$ Photoluminescence from Er-Doped Amorphous SiO$_x$ Films Prepared by Pulsed Laser Deposition at Room Temperature: The Effects of Oxygen Concentration; Applied Physics Letters, vol. 82, No. 20, May 19, 2003, pp. 3436-3438.

Jung H. Shin, et al., Effect of Hydrogenation on Room-Temperature 1.54 μm Er$^{3+}$ Photoluminescent Properties of Erbium-Doped Silicon-Rich Silicon Oxide; Applied Physics Letters, vol. 73, No. 25, Dec. 21, 1998, pp. 3647-3649.

T.G. Kim, et al., Controlling the Formation of Luminescent Si Nanocrystals in Plasma-Enhanced Chemical Vapor Deposited Silicon-Rich Silicon Oxide Through Ion Irradiation; Journal of Applied Physics, vol. 91, No. 5, Mar. 1, 2002, pp. 3236-3242.

M. Li, et al. Ellipsometry Investigation of Nucleation and Growth of Electron Cyclotron Resonance Plasma Deposited Silicon Films; J. Vac. Sci. Technol. A 11(4) Jul./Aug. 1993, pp. 1686-1691.

H.S. Bac, et al., Electroluminescence Mechanism in SiO$_x$ Layers Containing Radiative Centers; Journal of Applied Physics, vol. 91, No. 7, Apr. 1, 2002, pp. 4078-4081.

Giorgia Franzó, et al., Enhanced Rare Earth Luminescence in Silicon Nanocrystals; Materials Science and Engineering B69-70, 2000, pp. 335-339.

Rozo, C. et al., Spectroscopic Study of Rare Earth Doped Nano-Crystalline Silicon in SIO2 Films. *Quantum Confined Semiconductor Nanostructures. Symposium (Mater. Res. Soc. Symposium Proceedings vol. 737)* Mater. Res. Soc Warrendale, Pa, USA, 2003. pp. 517-522, XP 002310621. ISBN:1-55899-674-5.

Fujii, Minoru et al., Excitation of Intra-4fShell Luminescence of Yb$^{3+}$ by Energy Transfer from Si Nanocrystals. *Applied Physics Letters*. American Institute of Physics. New York, USA. vol. 73, No. 21. Nov. 23, 1998, pp. 3108-3110, XP 012021485. ISSN: 0003-6951.

Pacifici, D. et al., Erbium-Doped Si Nanocrystals: Optical Properties and Electroluminescenct Devices. *Physica E. Elsevier netherlands*, vol. 16, No. 3-4, Mar. 2003. pp. 331-340, XP 002310622. ISSN: 1386-9477.

Seo, Se-Young et al., Intense Blue-White Luminescnece from Carbon-Doped Silicon-Rich Silicon Oxide. *Applioed Physics Letters*. vol. 84, No. 5. Feb. 2004. pp. 717-719.

Seo, Se-Young et al., Enhancement of the Green, Visible Tb$^{3+}$ Luminescence from Tb-Doped Silicon-Rich Silicon Oxide by C Co-Doping. *Applied Physics Letters*. vol. 84, No. 22. May 2004. pp. 4379-4381.

* cited by examiner

SOLID STATE WHITE LIGHT EMITTER AND DISPLAY USING SAME

RELATED APPLICATIONS

This application claims the benefit of U.S. Provisional Application No. 60/500,686 filed Sep. 8, 2003.

FIELD OF THE INVENTION

This invention relates to solid state light emitting devices and more particularly to such devices which produce white light.

BACKGROUND OF THE INVENTION

Solid state light emitting devices such as light emitting diodes are extremely useful because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. However, because large scale semiconductor manufacturing techniques can be used, many solid state lamps can be produced at extremely low cost. One such device is the solid state light emitting diode (LED) which has low fabrication (costs, long operational lifetimes and low maintenance costs.

Light emitting diodes (LEDs), and similarly constructed super luminescent diodes and semiconductor diode lasers, are commercially available and a wide variety of designs and manufacturing techniques have been developed. In addition to applications such as indicator lights on home and consumer appliances, audio visual equipment, telecommunication devices and automotive instrument markings, such LEDs have found considerable application in indoor. and outdoor informational displays. Until recently, LEDs have produced light only in the red, green or amber ranges and have not been generally suitable for replacing, for example, incandescent bulbs, with normally a white luminescence, in a wide variety of display applications. The recent introduction of a bright blue LED, however, allows white light LED systems to be realized and thus has the potential to open the display market to LEDs by providing a practical means to achieve both full color and white light illumination.

The practical advantages of LED displays over those using incandescent bulbs are many. The operational lifetime (in this case, defined as continual illumination) of a LED is on the order of ten years or over 50,000 hours, whereas incandescent bulbs often burn out in the order of 2000 hours, thus leaving an empty pixel in the display message. Such recurrent failures make a display unreadable and, therefore, not useful. These conditions (i.e., broken or missing pixels) require constant repair leading to a significant maintenance problem for providers of display signs based on incandescent illumination devices. With the long operational lifetime of a LED-based sign board, the pixels rarely burn out and the illuminated message remains legible over long operational periods.

Similarly, LED lamps are considerably more robust. When exposed to stress, mechanical shocks, or temperature variations often encountered in an outdoor environment they are less likely to fail than incandescent lamps. This attribute is especially important when the signage is utilized in an environment such as vehicular traffic, e.g., roadway signage to mark highway construction sites, bridges, tunnels, or traffic control markings, in which perishable filaments used in the incandescent lamps frequently break due to constant vibration motion, Further, incandescent and fluorescent lamps are constructed with fragile glass exterior casings whose breakage makes the lamp useless, and by extension, the message on the sign board illegible. Due to severe environmental conditions on roadways, glass breakage of incandescent and fluorescent lamps is an all too frequent mishap. The solid state LED lamp has no filaments to break and is housed within a durable plastic casing, as the primary device envelope or package (typically being of considerable thickness), thereby exhibiting a high level of imperviousness to extreme outdoor environmental stresses. With respect to outdoor signage applications, displays can contain up to 1 million or more pixels or lamps. Thus the maintenance costs related to replacement of non-operational incandescent lamps or miniature fluorescent (or neon) lamps are high and unfortunately, continual.

Hence, an emerging trend in the manufacturing and marketing of informational displays or signage, especially for outdoor usage, is to utilize solid state LED lamps as a replacement for more conventional incandescent bulbs. The major end user benefits are the lower power consumption costs and the longer operational lifetime (hence, reducing maintenance costs). A further benefit is the rapid relaxation times of a solid state device affording an opportunity to display rapidly changing information messages incorporating video or lifelike animation.

Given the desirability of white light displays (e.g., commercial bank "time and temperature" message boards, stadium scoreboards), considerable effort has been expended to produce white light LEDs. Although the recent availability of the blue LED makes a full color, and by extension a white light display realizable, conventionally it has been considered that such a display would require multiple LEDs. The multiple LEDs would be then incorporated into complicated and expensive LED modules to obtain the required broad band illumination necessary to provide white light. Even if a discrete LED lamp were constructed that provides white illumination (as opposed to the utilization of a multitude of single die, single color discrete LED lamps in a module or sub-assembly), the current state of the art requires the utilization of multiple dies and typically at least four electrical leads to power these dies. U.S. Pat. No. 4,992,704 issued to Stinson teaches a variable color light emitting diode having a unitary housing of clear molded solid epoxy supporting three dies characterized as producing color hues of red, green and blue, respectively. There have been some recent introductions of commercial "full-color" LED lamps, that are essentially discrete lamps which afford a means of producing white light. All currently available examples of such lamps contain a minimum of three dies (or chips)—one red, one green and one blue, encapsulated in a single epoxy package. The chips are powered via at least 4 electrical leads. These complicated multiple die, variable color devices provide an expensive and complicated method of offering white light illumination. Furthermore, these multiple die white lamps are rather inefficient in the present state of the art, offering luminosity far below that realized by existing monochromatic light emitting diode lamps, even when a very large quantity of dies are functionally incorporated into the discrete lamp assembly.

The utility of solid state lamps that offer white light illumination is clear. However, at present there is a very limited number of such solid state lamps available. In signage applications where a small pixel of light is frequently required to offer the highest possible resolution of the message or video image, the most practical solid state lamps for display applications are the LED lamps. The LED lamp can have very narrow angles of irradiance and are very small in size when compared wish with other means of providing a radiant surface. However, the methods of fabricating white LED lamps are limited. A conventional approach is to fabricate a large cluster of red, green and blue LED discrete lamps, housed in multiple lamp (up to 30) subassemblies or modules. By providing multiple power sources to control all of the discrete lamps, these large modules can appear, from a distance, to provide white light by the spatial mixing of blue, green and red sub-pixels of light given off by the individual discrete LED lamps that comprise the module. While the lamps that make up the modules may be individually addressable, and hence, offer the opportunity to, selectively and individually, provide red, green and blue light (or combinations thereof), such modular systems are complex and costly means of providing white light for a solid state display. Further, as these modules are rather large, the ultimate resolution of the display will always be lower than that of a conventional single lamp pixel display.

Whereas multiple discrete dies housed within a single polymeric matrix (as taught by Stinson) may provide a discrete LED lamp such that the illumination could appear white to an observer, the individual dies would still need to be individually powered and the lamp would require multiple leads in order to effect the simultaneous emission of multiple wavelength light. Thus, this multiple die LED lamp would be rather expensive to fabricate, and would require expensive and complicated circuitry to power and control in an outdoor display. Despite these problems, both methods point to the utility of generating white illuminance.

It is well known that so-called fluorescent lamps provide white light illumination. In a fluorescent lamp, the Hg vapor in the vacuum tube is excited by an electrical discharge. The excited Hg atoms emit light, primarily in the ultraviolet region (e.g., 254 nm, 313 nm, 354 nm), which is absorbed by the inorganic phosphors coating the inside walls of the tube. The phosphors then emit light. These inorganic phosphors are designed as such to offer white light emission by "down-converting" (i.e., transforming a higher frequency, shorter wavelength form of energy to a lower frequency, longer wavelength form of energy) the ultraviolet emissions of the excited states of atomic Hg into a broad spectrum of emitted light which appears as white to the observer. However, these light emitting devices are not solid-state, and miniaturization of these fluorescent bulbs to provide suitable pixel resolution for display applications has never been practically accomplished. In fact, the primary application of miniature fluorescent lamps (with long operational lifetimes, but unfortunately high power consumption when compared with solid state LED lamps) in displays is to provide back lighting to liquid crystals that are individually addressed at the pixel level. Furthermore, these miniature fluorescent lamps remain fragile light emitting devices by virtue of their glass housings and are unsuitable for use in display applications in which the lamps are exposed to extreme environmental stresses. Such stresses can not only break the glass housing, but effect delamination of the powder coatings from the interior wall of the glass housing. It would be desirable to generate white light by radiative energy transfer, where the luminescent centers are an integral part of the assembly such that a thick, difficult-to-fracture housing structure (plate or bulb) could provide white illumination from the interior thickness of such housing structure, and not from a semi-permanent powder coating placed on one side of a housing surface.

In a further example of generating white light, in the absence of phosphor coatings, it was disclosed in Chao, et al., "White Light Emitting Glasses," Journal of Solid State Chemistry 93, 17–29 (1991) (see also El Jouhari, N., et al., "White light generation using fluorescent glasses activated by $Ce^{3+}$, $Tb^{3+}$ and $Mn^{2+}$ ions, " Journal de Physique IV, Colloque C2, supplement au Jouirnal de Physique III, Volume 2, October 1992, C2-257 to C2-260), that vitreous materials are capable of generating white light by simultaneous emission of blue, green and red emitting fluorescent centers in $B_2O_3$-based glass that simultaneously contain $Ce^{3+}$, $Tb^{3+}$, and $Ma^{2+}$ as activators. These glasses provide white illumination by offering the blue emission of $Ce^{3+}$ as well as by the transfer of excited state energy from the $Ce^{3+}$, to $Te^{3+}$ and $Mn^{2+}$, whose luminescence occurs respectively in the green and red parts of the visible light spectrum.

Mixed rare earth borates can be used to provide white light illumination, Aria down conversion, with excitation of the borate powders with a primary (ultraviolet) radiation between 250 nm and 300 nm. Similarly, for cathode ray applications, white light-emitting mixed fluorescent materials can be made by careful formulation of green fluorescent materials (48 to 53% w/w), red fluorescent materials (37 to 40% w/w) and blue fluorescent materials (10 to 13% w/w).

While the devices in the above examples vary in concept and construction, they demonstrate the utilization of red, green and blue fluorescent materials, all inorganic in composition, which when excited by photons or electron beams, can release multiple wavelengths of secondary light emission (luminescence of either fluorescent or phosphorescent character) to exhibit white light to the observer. This is generally true, even if microscopic domains of discrete colored light emission can be observed on the Lambertian surface of the light-emitting device.

Tanaka, S., et al., "Bright white-light electroluminescence based on nonradiative energy transfer in $Ce^-$ and Eu-doped SrS films," App. Phys. Lett. 51 (21), Nov. 23, 1987, 1662–1663, describes the generation of a white-light emitting thin-film electroluminescent (EL) device using $Ce^-$ and Eu-doped strontium sulfide (SrS) inorganic phosphors. In the EL excitation of the SrS:Ce,Eu device, nonradiative energy transfer from the $Ce^{3+}$ luminescent center. to the $Eu^{2+}$ luminescent center plays an important role in generating broad EL emission extending from the blue to the red, thereby generating white light.

Similarly, some recent discussions of AlGaN electroluminescent systems with Zn and Si dopants have indicated that some white light can be generated. While it is useful for a single device to be constructed in which dopants offer a multitude of luminescent wavelengths, dopants invariably alter the electrical and lattice structures of semiconductors and as such, the performance of these devices are considerably poorer than for corresponding semiconductors free of dopant that emit monochromatic irradiation, as a result of being dopant-free.

Until recently, most light emitting diodes have been semiconductor-based and most electroluminescent devices have been inorganic based. While organic materials have been utilized to prepare certain thin-film electroluminescent devices, no organic based LEDs are commercially available. Further, organic-based LEDs are at present plagued by extremely short operational lifetimes due to degradation of the organic charge-transfer materials. In all of these systems, the organic materials, used in thin films on conducting inorganic substrates such as ITO, are actively participating in the electron-hole recombination necessary to generate an excited state, and, by subsequent radiative decay, light.

Recently, the literature has discussed approaches directed to fabricating organic LED or electroluminescent devices and in certain cases, white light emission has been observed from these experimental designs. As an example, white light from an electroluminescent diode made from poly[3(4-octylphenyl)-2,2'-bithiophene] and an oxadiazole derivative have been reported. Spectroscopic analysis indicates that the apparent white light is composed of blue (410 nm), green (530 nm),and red-orange (520 nm) luminescent centers. Electroluminescent devices incorporating the red fluorescing material Rhodamine onto an inorganic substrate have been effective in yielding some white light as well.

White light emission from thin film organic electroluminescent cells based on poly(vinylcarbazole PVK) thin films on ITO-coated glass has also been recently reported. The cell has the construction of Mg:Ag:Alq:TAZ:doped PVK:ITO: Glass where the conducting ITO layer injects holes into the organic based PVK thin film layer which has high hole drift mobilities. Simultaneously, electrons are injected by the tris(8-quinolato) aluminum (III) complex layer Alq, into the hole blocking electron transporting layer composed of the organic molecule 3-(4'tert-butylphenyl)-4-phenyl-5-(4'-biphenyl)-1,2,4-triazole, TAZ. At the interface of the organic poly(vinlycarbazole) layer with the TAZ layer, recombination of holes and electrons take place which excites the organic, aromatic, carbazole pendant moiety that comprises the polymer. It is well known that the excited carbazole moiety within the polymer aggregates in the excited state leads to blue excimer emission, in the absence of quenchers or dopants. In the example of the organic Mg:Ag:Alq:TAZ: doped PVK:ITO:Glass electroluminescent device, the quenchers of excimeric emission, axe the dopants blue emitting 1,1,4,4-tetraphenylbuta-1,3-diene (TPB), green emitting 7-diethylamino-3-(2'benzothiazoyl)coumarin (Coumarin-6), and red emitting dicyanomethylene-2-methyl-6-p-dimethylaminostyryl-4H-pyran (DCM-1).

U.S. Pat. No. 5,045,709 issued Apr. 11, 1995 to J. E. Littman et al. discloses a white light emitting internal junction organic electroluminescent device comprising an anode, an organic electrolutninescent medium and a cathode. The organic electroluminescent medium further comprises a hole injecting and transporting zone: contiguous with the anode, and an electron injecting aid transporting zone contiguous with the cathode. The electron injecting and transporting zone further comprises an electron injecting layer in contact with the cathode. The portion of the organic electroluminescent medium between the the electron injecting layer and the hole injecting and transporting zone emits white light in response to the hole-electron recombination, and comprises a fluorescent material and a mixed ligand aluminum chelate.

Japanese Patent Publication 04289691 of Mitsubishi Cable Industries, Ltd., published Oct. 14, 1992, discloses an electroluminescent device comprising a fluorescent dye-fixed silica layer coated with a transparent electrode layer, a luminescing (light-emitting) layer containing a phosphor, a backside electrode layer, a water-sorbing layer, an encapsulating film, and an insulating layer.

In the Mitsubishi patent publication, the silica layer may be formed by a sol gel process using metal alkoxides in a solvent such as ethanol, isopropanol, or dimethyl ether. A Rhodamine 6G-doped silica layer is described to exhibit white luminescence. The luminescing layer may be for example on the order of 15 microns in thickness, and is formed by a sol gel technique yielding ZnS or ZnCdS doped with a dopant such as copper, aluminum, manganese, chlorine, boron, yttrium, or rare earth dopant. The luminescing layer may also contain scattered phosphor material. The average grain size of grains in the luminescing layer is generally greater than 10 microns, and preferably is in the range of from 15 to 40 microns. The luminescing layer may for example contain from 30 to 80% phosphor. A disclosed advantage of the foregoing structure is that one can change the phosphor in the luminescing layer, and thereby change the color of the whole material.

Japanese Patent Publication 60170194 of Sony Corporation, published Sep. 3, 1985, discloses a white light-emitting electroluminescent device with a luminescent layer containing a mixture of a blue-green-emitting phosphor and Rhodamine S. Since Rhodamine S strongly fluoresces orange by excitation with a bluish-green light, a white light of high luminosity may be obtained even at low voltage. This reference discloses a phosphor emitting blue-green light, in which ZnS is doped with Cu and Cl, as well as a phosphor emitting yellow light, in which ZnS is doped with Cu and Mn. ZnS may also be doped with Cu and Br to produce green light.

The Sony portent publication discloses a multilayer electroluminescent article, including sealing layers of protective film of a material such as Aclar polymer, a polyester layer, a transparent electrode formed of indium tin oxide (ITO), a light-emitting layer, and a backside electrode. The light-emitting layer may comprise 50–95% by weight of ZnS doped with the aforementioned dopant species (e.g., 0.045% wt. Cu, and 0.020% wt. Cl) and 5–50% wt. Rhodamine S.

Not withstanding the progress made in using organic fluorescers as luminescent sites within either electron-transport or hole-transport layers and affording thin-film interfacial hole-electron recombination, the current state of the art finds it difficult to generate organic based dies with reasonable operational lifetimes. By their very nature, these donor-acceptor complexes are prone to reaction with the surrounding medium. As a result, many of these organic molecules degrade under constant excitation to the excited state and consequently the organic-based LEDs fail. Those fluorescers with extremely high quantum, yields of fluorescence, which by definition necessitate short excited state lifetimes and are unlikely to be quenched or degraded by oxygen or other reactants, do not have sufficient electron or hole transport properties to allow for device-wide localized hole-electron recombination in the ground state. However, their proximity to the holes, as dopants in a hole transporting layer, as an example, may make the excited states of the luminophors more easily oxidized than would normally be the case. This would be especially true for excited state species, even if the ground state of the luminophors are stable to the holes in the hole-transporting layer. Similarly arguments regarding excited state reduction would be applicable for dopants sequestered within an electron-transport layer.

It would thus be highly desirable to develop a simple solid state LED lamp, with a minimum of power leads, (i.e., 2) exactly as practiced in single color LED lamps, such that three domains of red, green and blue light ate generated and yet the white light emission is apparent to an observer, all while offering significantly reduced die costs (one versus three) and low fabrication costs in the design of corresponding displays and signage, high medium resolution (small pixel or lamp size), rapid switching to the on and off states (to enhance live video imaging), and with a high luminous efficiency.

SUMMARY OF THE INVENTION

It would be most desirable, if a white light emitting device could be fabricated that took advantage of the simultaneous emission of red, green and blue luminescent centers, using rare earth doped group IV semiconductor nanocrystals.

It is the purpose of some embodiments of the present invention to provide while light solid state luminescent devices using a single die, which use rare earth doped group IV semiconductor nanocrystals to generate the polychromatic white light, thus providing a solid state illumination device with white illuminance, without the need for multiple power leads or for more than one discrete LED lamp.

According to one broad aspect, the invention provides a light emitting device comprising: at least one single-die semiconductor light-emitting device coupleable with a power supply to emit visible light, the light-emitting device comprising rare-earth doped group IV nanocrystal material (REGIVN).

In some embodiments, a light emitting device comprises: a substrate; at least one layer containing rare-earth doped group IV nanocrystal material, the at least one layer collectively emitting a visible light output when energized.

In some embodiments, the visible light is a white light.

In some embodiments, the REGIVN is a silicon or silicon carbide nanocrystal material.

In some embodiments, the at least one layer comprises a single layer containing a respective rare earth dopant for each of red, blue and green.

In some embodiments, the at least one layer comprises three layers with each layer containing a respective rare earth dopant for one of red, blue and green.

In some embodiments, the at least one layer comprises three layers with each layer containing a respective rare earth dopant.

In some embodiments, the three layers are stacked on top of each other.

In some embodiments, the three layers are arranged adjacent to each other.

In some embodiments, said at least one layer comprises: a first layer doped with a group IV dopant selected from a group consisting of erbium, terbium and yttrium to provide green light; a second layer doped with a group IV dopant selected from a group consisting of thulium and cerium to provide blue light; a third layer doped with a group IV dopant selected from a group consisting of europium and prasodymium to provide red light.

In some embodiments, said at least one layer comprises: a single layer doped with a first group IV dopant selected from a group consisting of erbium, terbium and yttrium to provide green light, a second group IV dopant selected from a group consisting of thulium and cerium to provide blue light, and a group IV dopant selected from a group consisting of europium and prasodyinium to provide red light.

In some embodiments, said at least one layer comprises: a first layer doped with erbium to provide green and blue light; a second undoped layer of silicon nanocrystal material to provide red light.

In some embodiments, said at least one layer comprises: a first layer doped with erbium to provide green and blue light; a second layer doped with a, group IV dopant selected from a group consisting of europium and paseodymium to provide red light.

In some embodiments, the light emitting device further comprises a first electrode and a second transparent electrode across which a power supply signal can be applied to energize the light emitting device.

In some embodiments, the first electrode is a transparent conductive oxide electrode or semitransparent metal electrode.

In some embodiments, the substrate is a conductive substrate.

In some embodiments, the substrate is made of a material selected from a group consisting of SiC, GaN and ZnO.

In some embodiments, the substrate is a substantially non-conductive substrate.

In some embodiments, the substrate is made of a material selected from a group consisting of sapphire, silicon dioxide, fuse silica and AlN.

In some embodiments, the light emitting device further comprises a housing member formed of a light-transmissive material, said housing memder defining therewithin an interior volume.

In some embodiments, the light emitting device further comprises first and second electrical contacts extending through said housing member and coupleable to a power supply which is constructed and arranged for imposing a voltage on said light emitting device, to induce emission of said white light.

In some embodiments, an array of light emitting devices and a user-responsive controller for selectively illuminating specific ones of said light-emitting devices.

In some embodiments, a light emitting device further comprises: group II-VI or III-V nanocrystal material arranged to receive light emitted by the rare earth doped group IV nanocrystal material as a pump light source, the group II-VI or III-V nanocrystals flouresceng at a plurality of wavelengths when energized by the pump light source.

In some embodiments, a light emitting device comprises: a substrate; at least one layer containing the rare earth doped group IV nanocrystal material; at least one layer of group II-VI or III-V nanocrystals arranged to receive light emitted by the at least one layer containing rare earth doped group IV nanocrystal material as a pump light source, the group II-VI or III-V nanocrystals flouresceng at a plurality of wavelengths when energized by the pump light source.

In some embodiments, the group II-VI or III-V nanocrystals are selected from a group consisting of ZnS, CdS, ZnSe, CdSe, GaN, InP and GaP.

In some embodiments, the plurality of wavelengths collectively produce white light.

In some embodiments, a light emitting device further comprises a top electrical contact layer wherein the layers are arranged in sequence as follows: the substrate; the at least one layer containing rare earth doped group IV nanocrystal material; the top electrical contact layer; the at least one layer containing group II or VI nanocrystals; wherein the at least one layer containing group II or VI nanocrystals uses photon energy to drive the nanocrystal.

In some embodiments, a light emitting device further comprises a top electrical contact layer, the layers arranged in sequence as follows: the substrate; the at least one layer containing rare earth doped group IV nanocrystal material; the at least one layer containing group II or VI nanocrystals; the top electrical contact layer; wherein the at least one layer containing group II or VI nanocrystals uses both electrical energy and photon energy to drive the nanocrystals.

In some embodiments, said device has a multi-layer structure comprising layers selected from the group consisting of nanocrystals of group IV, II-VI and III-V.

In some embodiments, primary radiation produced by the at least one layer containing REDGIVN is down-converted by the at least one layer of group II-VI or III-V nanocrystals to at least two distinct and separable regions of red and/or green and/or blue light, with said at least two regions of red and/or green and/or blue light mixing to produce a different colored output.

In some embodiments, primary radiation produced by the at least one layer containing REDGIVN is down-converted by the at least one layer of group II or VI nanocrystals to between 2 and 10 distinct and separable regions of white light and light of the color hue red, green or blue light.

According to another broad aspect, the invention provides a liquid crystal display comprising: a backlight member including a multiplicity of light-emitting devices, each light-emitting device comprising: at least one single-die semiconductor light-emitting device coupleable with a power supply to emit visible light, the light-emitting device comprising rare-earth doped group IV nanocrystal material (REGIVN).

In some embodiments, the LCD comprises: a substrate; at least one layer containing the rare earth doped group IV nanocrystal material; at least one layer of group II or VI nanocrystals arranged to receive light emitted by the at least one layer containing rare earth doped group IV nanocrystal material as a pump light source, the group II or VI nanocrystals flouresing at a plurality of wavelengths when energized by the pump light source.

According co another broad aspect, the invention provides a display, including: a viewable panel including a multiplicity of light-emitting devices, each light-emitting device comprising: at least one single-die semiconductor light-emitting device coupleable with a power supply to emit visible light, the light-emitting device comprising rare-earth doped group IV nanocrystal material (REGIVN).

In some embodiments, each said at least one single-die semiconductor light-emitting device further comprises: a substrate; at least ones layer containing the rare earth doped group IV nanocrystal material; at least one layer of group II or VI nanocrystals arranged to receive light emitted by the at least one layer containing rare earth doped group IV nanocrystal material as a pump light source, the group II or VI nanocrystals flouresing at a plurality of wavelengths when energized by the pump light source.

DETAILED DESCRIPTION OF THE PREFERRED EMBODIMENTS

The present invention provides a highly efficient white light emitting device that may be simply and economically fabricated. The device utilizes a solid state light emitting device for generating tri color emissions due to the rare-earth doped group IV nanocrystals to yield white light.

White light emitting solid state devices may be made by a method provided by an embodiment of the present invention, utilizing a electro-luminescent process whereby the primary photon generated in the active region of the device is electrically excited to produce primary blue emission from the rare-earth ions or centers, as well as green and red rare-earth ions or centers. Such a device is able to generate relatively monochromatic light, typical of all heretofore colored dies and lamps, and can also generate a broader emission that provides white light from red, green, and blue emission centers.

Such a device for white light emission, based on rare-earth doped nanocrystals, requires the primary light to be electrically driven to the group IV nanocrystals which then transfers it's exciton energy to the rare-earth ion. Both inorganic and organic rare-earth materials can be utilized to generate a mixture of blue, green and led luminescent emissions. A significant advantage of organic luminescent materials is their ability to be incorporated into the nanocrystals structure by a Plasma Enhanced Chemical Vapor Deposition (PECVD) process.

As discussed above, there have been disclosures regarding the generation of white light in solid state illumination devices using radiative or non-radiative energy transfer and these examples use primarily inorganic dopants in the active layers of electroluminescent cells or display systems, but none are known that apply the principles of the present invention to white light sources employing rare earth doped semiconductor nanocrystals that form a Metal Oxide Semiconductor (MOS) structure.

Figure 1:
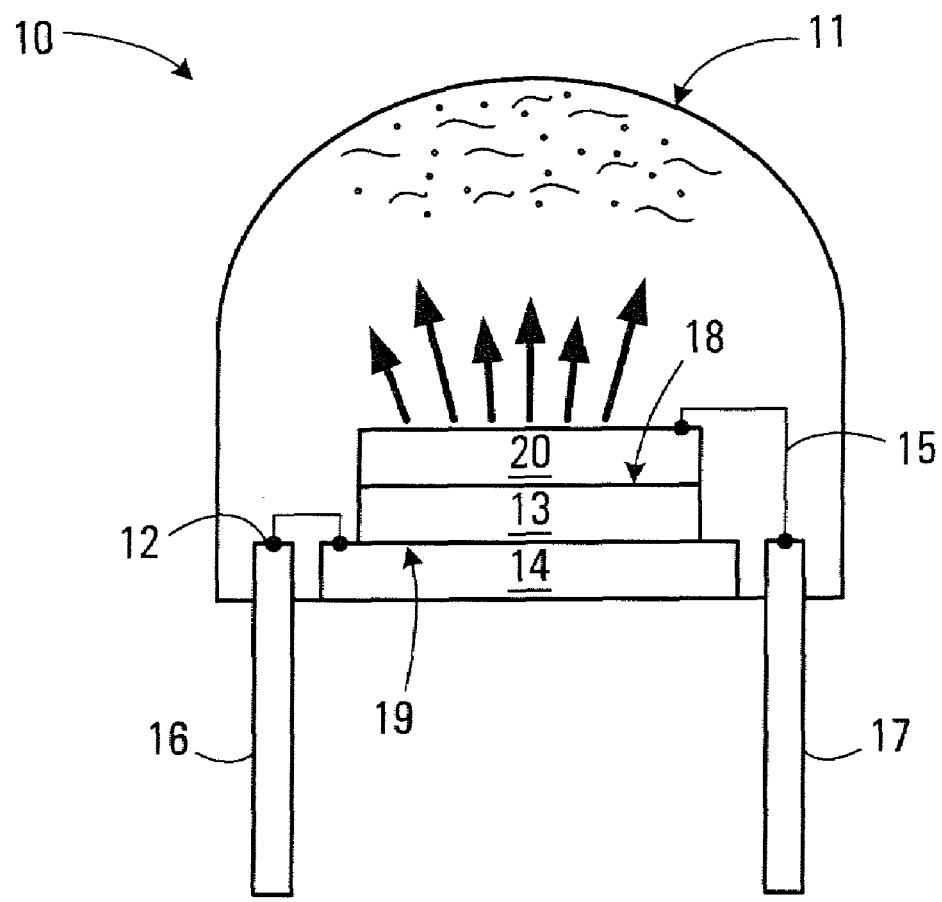
FIG. 1 is a side view of a solid state white light emitting device provided by an embodiment of the invention.

Referring now to the drawings, FIG. 1 shows a white light emitting device assembly 10 constructed in accordance with one embodiment of the invention. This assembly comprises a light-transmissive enclosure 11 having an interior volume therewithin. The enclosure 11 may be formed of any suitable material having a light-transmissive character, such as a clear or translucent polymer, or a glass material. The particular shape of the enclosure is not important. The light-transmissive enclosure 11 houses in its interior volume a light emitting device die 13 positioned on a conductive support 14. The enclosure may include a lumiphoric medium that causes light to scatter. Also shown is a transparent electrode 20 on top of the die 13. First and second electrical conductors 16 and 17 are connected to top and bottom faces 18 and 19 of die 13 respectively as follows. The top face 18 of the die 13 is coupled via the transparent electrode 20 to the electrical conductor 17 by a lead 15. The bottom face 19 of the die 13 is coupled via the conductive support 14 to the electrical conductor 16 by lead 12. The die 13 has a rare-earth doped nanocrystal material, e.g. with cerium, erbium, europium component(s), or mixtures thereof, which generates the blue, green, red light output from the top face 18 of the die 13 to produce white light.

In the above described embodiments, transparent electrode 20 is simply any material that can be deposited on the die to get uniform current injection across the film. The transparent electrode 20 may, for example, be a transparent conductive oxide electrode or a semitransparent metal electrode. Examples of suitable materials for the transparent electrode 20 include Indium Tin Oxide and doped Polysilicon. In some embodiments, an additional metal contact is deposited on top of the transparent electrode 20. For example, a small aluminum contact might be deposited to allow a point of attachment for electrical leads. The support 14 may be a conductive substrate as in the illustrated example. Alternatively, the support may be a non-conductive substrate in which case an additional contact layer would be required to enable connection of a lead to the bottom face 19 of the die 13. The rare-earth doped nanocrystal material may be one layer with multiple dopants to give the white light, or may be a number of separate layers each containing a respective dopant such that together the layers produce the white light. At least one layer of rare-earth doped nanocrystal material will be present. In some embodiments, a layer of undoped SRSO can be provided to give the red component of light.

For red light, europium or prasodymium dopants may be used or, as indicated above SRSO on its own may be used. For green light, erbium, terbium or yttrium may be used. For blue light, thulium or cerium may be used. It is noted that erbium will give off both green and blue light, and as such if there is a sufficient concentration of erbium it may not be necessary to have separate layers for green and blue. Rather, an erbium layer for green and blue and a layer for red may be employed.

For all embodiments, respective layers can be provided for each dopant, or as indicated above the dopants can be mixed into a single layer.

Applicant's co-pending applications U.S. application Ser. No. 10/761,275 entitled "Doped Semiconductor Powder and Preparation Thereof", filed Jan. 22, 2004, U.S. application Ser. No. 10/761,409 entitled "Doped Semiconductor Nanocrystal Layers and Preparation Thereof", filed Jan. 22, 2004, PCT Application No. PCT/CA2004/000076 entitled "Doped Semiconductor Nanocrystal Layers or Doped Semiconductor Powders and Photonic Devices Employing Such Layers or Powders", filed Jan. 22, 2004, and PCT Application No. PCT/CA2004/000075 entitled "Doped Semiconductor Nanocrystal Layers and Preparation Thereof", filed Jan. 22, 2004 teach doped semiconductor powders and layers doped with rare-earth elements and processes and preparations for making these layers and powders. Preferably, the layer or layers used in the die 13 of FIG. 1, and in the other embodiments described below, are implemented in accordance with any of the described materials or processes of these applications all of which are hereby incorporated by reference in their entirety. More particularly, the rare earth doped group IV nanocrystal material is REDGIVN material described in detail below with reference to FIGS. 10 to 14.

It is also noted that if a PECVD is used to produce the rare-earth doped silicon nanocrystals, a rare-earth doped silicon carbide nanocrystal may result and this is also acceptable for use in any of the embodiments described herein.

Various detailed examples of the die 13 will now be described with reference to FIGS. 2 through 6.

Figure 2:
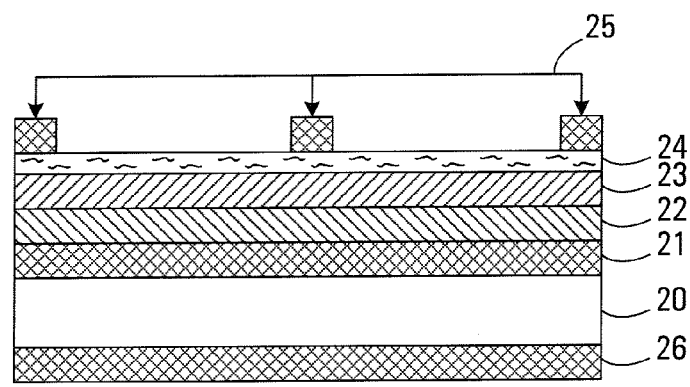
FIG. 2 is a side sectional view of a solid state white light emitting layered structure provided by an embodiment of the invention.

In one embodiment shown in FIG. 2, a leaded, nanocrystal based light emitting layered structure is provided. This can, for example, be used in a light emitting device similar to that of FIG. 1, or in other applications. There are three layers 21, 22, 23 of rare-earth doped silicon nanocrystals that are grown on top of a p or n type single crystal silicon substrate 20 with a resistivity of 0.05–0.01 $\Omega$ cm and a thickness of 100–800 micron. In an example implementation, the first layer 21 is doped with europium with its concentration being in the range of 0.5 to 10 atomic percent and the silicon concentration being 39 to 46 atomic percent in the silicon dioxide matrix. The first layer 21 can have a thickness of 30 to 150 nm. The second layer 22 is doped with erbium with its concentration being on the range of 0.5 to 10 atomic percent and the silicon concentration being 39 to 46 atomic percent in the, silicon dioxide matrix. The second layer 22 can have a thickness of 30 to 150 nm. The third layer 23 is doped with thulium with its concentration being in the range of 0.5 to 10 atomic percent and the silicon concentration being 39 to 46 atomic percent in the silicon dioxide matrix. The third layer 23 can have a thickness of 30 to 150 nm. This structure is then annealed at 800–1100° C. for 5 to 60 minutes in a $N_2$ atmosphere. A capping layer 24 of Indium Tin Oxide (ITO) is grown on the third layer 23 with a resistively of 1–50 $\Omega$ cm and a thickness of 100 nm to 450 nm. A layer of aluminum of 2000 nm is evaporated on top of the ITO. A top electrical contact mask is photolithographed on the top surface of the aluminum and then etched off to form the top electrical contacts 25. A bottom contact 26 is formed by evaporating 1000 nm of aluminum onto a bottom of the silicon substrate 20.

In the embodiment of FIG. 2, three rare earth doped layers are provided, and each layer contributes light for red, green or blue. More generally, in some embodiments three layers are provided that each contributes light such that collectively a white light is emitted lay the three layers. The light emitted by each layer may not necessarily map one-to-one to red, green and blue.

Figure 3:
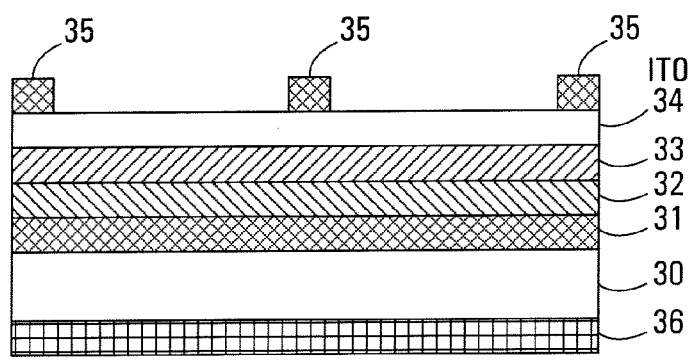
FIG. 3 is a side sectional view of a solid state white light emitting layered structure provided by an embodiment of the invention which has a transparent substrate so as to allow light emissions from both the top and bottom of the device.

FIG. 3 shows an light emitting layered structure provided by another embodiment of the invention comprising a leaded, nanocrystal based white light emitting device. This can, for example, be used in a light emitting device similar to that of FIG. 1, or in other applications. There are three layers 31,32,33 of the rare-earth doped silicon nanocrystals that are grown on top of a p or n type single crystal zinc oxide ZnO substrate 30 with a resistivity of 0.05–0.1 $\Omega$ cm and a thickness of 100–800 micron. The first layer 31 is doped with europium with its concentration being in the range of 0.5 to 10 atomic percent and the silicon concentration being 39 to 46 atomic percent in the silicon dioxide matrix. The first layer 31 can have a thickness of 30 to 150 nm. The second layer 32 is doped with erbium with its concentration being in the range of 0.5 to 10 atomic percent and the silicon concentration being 39 to 46 atomic percent in the silicon dioxide matrix. The second layer 32 can have a thickness of 30 to 150 nm. The third layer 33 is doped with thulium wish its concentration being in the range of 0.5 to 10 atomic percent and the silicon concentration being 39 to 46 atomic percent in the silicon dioxide matrix. The third layer 33 can have a thickness of 30 to 150 nm. This structure is then annealed at 800–1100° C. for 5 to 60 minutes in a $N_2$ atmosphere. A capping layer 34 of Indium Tin Oxide (ITO)

is growh on top of 33 with a resistively of 1–50 Ω cm and a thickness of 100 nm to 450 nm. A layer of aluminum of 2000 nm is evaporated on top of the capping layer 34. A top electrical contact mask is photolithographed on the top surface of the aluminum and then etched off to form the top electrical contacts 35. The bottom contact 36 is formed by evaporating 100–450 nanometer of ITO onto a bottom of the ZnO substrate 30 and then an electrical contact mask is photolithographed on the bottom surface of the ITO and then etched off to form the bottom electrical contact 36. Alternatively, a transparent bottom electrode can be used. Light emission can be obtained from both the top and bottom surface 30 since the ZnO is transparent.

Figure 4:
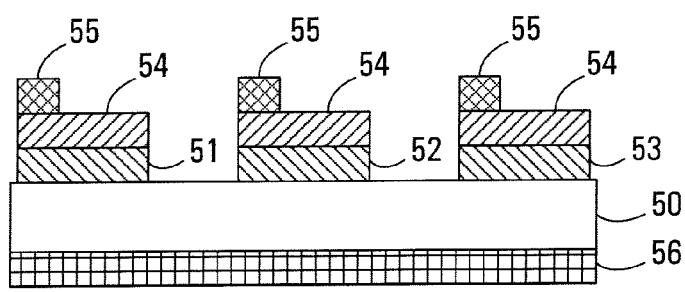
FIG. 4 is a side sectional view of a solid state white light emitting layered structure provided by another embodiment of the invention.

FIG. 4 is a side sectional view of a leaded, nanocrystal based white light emitting layered structure provided by an embodiment of the invention. This can, for example, be used in a light emitting device similar to that of FIG. 1, or in other applications. There are three layers 51,52,53 of the rare-earth doped silicon nanocrystals which are grown side by side on a p or n type single crystal silicon substrate 50 with a resistivity of 0.05–0.01 Ω cm and a thickness of 100–800 microns. The first layer 51 is doped with europium with its concentration being in the range of 0.5 to 10 atomic percent and the silicon concentration being 39 to 46 atomic percent in the silicon dioxide matrix. The first layer 51 can have a thickness of 30 to 150 nm. The second layer 52 is doped with erbium with its concentration being in the range of 0.5 to 10 atomic percent and the silicon concentration being 39 to 46 atomic percent in the silicon dioxide matrix. The second layer 52 can have a thickness of 30 to 150 nm. The third layer 53 is doped with thulium with its concentration being in the range of 0.5 to 10 atomic percent and the silicon concentration being 39 to 46 atomic percent in the silicon dioxide matrix. The third layer 53 can have a thickness of 30 to 150 nm. This structure is then annealed at 950–1000° C. for 5 to 60 minutes. A capping layer 54 of Indium Tin Oxide (ITO) is grown on top of layers 51,52,53 with a resistively of 1–50 Ω cm and a thickness of 100 nm to 450 nm. A layer of aluminum of 2000 nm is evaporated on top of the capping layer 54. A top electrical contact mask is photolithographed on tile top surface of the aluminum and then etched off to form a top electrical contacts 55. A bottom contact 56 is formed by evaporating 2000 nm of aluminum onto a bottom of the silicon substrate 50.

Figure 5:
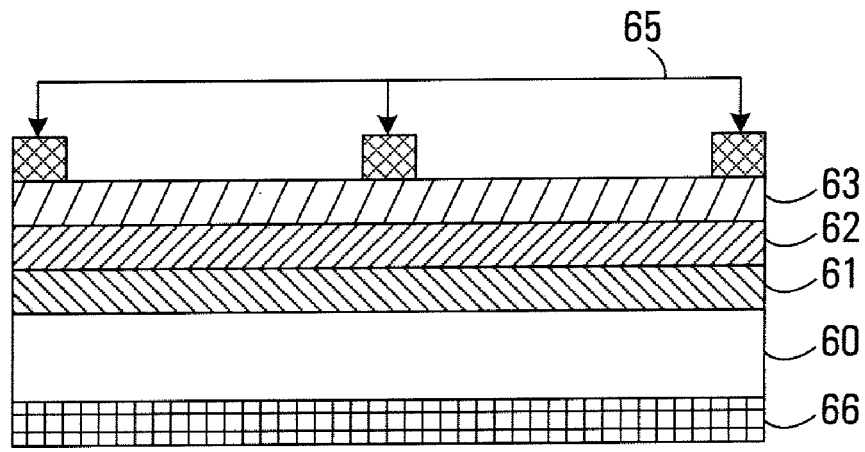
FIG. 5 is a side sectional view of a solid state light emitting layered structure provided by an embodiment of the invention.

In operation, upon electrical energization of the die array, die 51 effects radiation emission at a blue wavelength, die 52 effects radiation emission at a green wavelength and die 53 effects radiation at a red wavelength. By varying the electrical current to each of these layers the color and intensity of the solid state lamp can be controlled. In this embodiment, preferably there is a separate contact for each of the three dies which would be connected to the to electrical contacts 55, and the single bottom contract 56, FIG. 5 shows a leaded, nanocrystal based white light emitting layered structure provided by an embodiment of the invention. This can, for example, be used in a light emitting device similar to that of FIG. 1, or in other applications. There is one layer 61 of the rare-earth doped silicon nanocrystals which are grown on top of a p or n type single crystal silicon substrate 60 with a resistivity of 0.05–0.01 Ω cm and a thickness of 100–800 micron. The layer 61 is doped with erbium with its concentration being in the range of 0.5 to 10 atomic percent and the silicon concentration being 39 to 46 atomic percent in the silicon dioxide matrix. The layer 61 can have a thickness of 30 to 250 nm. The layer 61 gives both blue and green light. A second layer 62 is a layer of undoped SRSO with the silicon concentration being 39 to 46 atomic percent in the silicon dioxide matrix. The second layer 62 gives off red light. The layer can have a thickness of 30 to 150 nm. This structure is then annealed at 800–1100° C. for 5 to 60 minutes in a $N_2$ atmosphere. A capping layer 63 of Indium Tin Oxide (ITO) is grown on top of the second layer 62 with a resistively of 1–50 Ω cm and a thickness of 100 nm to 450 nm. A layer of aluminum of 2000 nm is evaporated on top of the caping layer 63. A top electrical contact mask is photolithographed on the top surface of the aluminum and then etched off to form a top electrical contact 65. A bottom contact 66 is formed by evaporating 1000 nanometer of aluminum onto a bottom of the silicon substrate 60.

Figure 6:
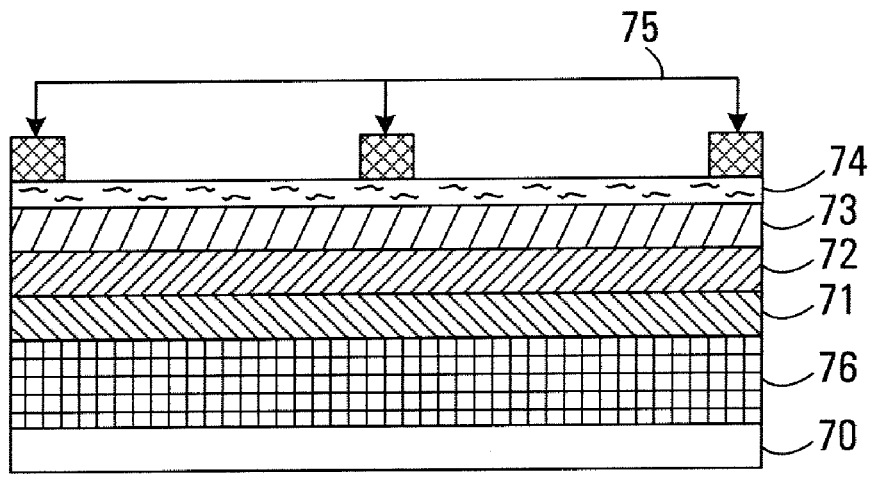
FIG. 6 is another side sectional view of a solid state light emitting layered structure provided by an embodiment of the invention featuring a transparent substrate which is non-conductive.

FIG. 6 shows a leaded, nanocrystal based white light emitting layered structure provided by an embodiment of the invention. This can, for example, be used in a light emitting device similar to that of FIG. 1, or in other applications. There are three layers 71,72,73 of the rare-earth doped silicon nanocrystals. There is a non-conductive substrate such as sapphire or fuse silica substrate 70 with a thickness of 100–800 micron thick. A bottom contact 76 is formed by evaporating 100–450 nm of ITO on top of the sapphire or fuse silica substrate 70 and then an electrical contact mask may be photolithographed on the top surface of the ITO and then etched off to form the bottom electrical contact 76. The first layer 71 is doped with europium with its concentration being in the range of 0.5 to 10 atomic percent and the silicon concentration being 39 to 46 atomic percent in the silicon dioxide matrix. The first layer 71 can have a thickness of 30 to 150 nm. The second layer 72 is doped with erbium with its concentration being in the range of 0.5 to 10 atomic percent and the silicon concentration being 39 to 46 atomic percent in the silicon dioxide matrix. The second layer 72 can have a thickness of 30 to 150 nm. The third layer 73 is doped with thulium with its is concentration being in the range of 0.5 to 10 atomic percent and the silicon concentration being 39 to 46 atomic percent in the silicon dioxide matrix. The third layer 73 can have a thickness of 30 to 150 nm. This structure is then annealed at 800–1100° C. for 5 to 60 minutes in a $N_2$ atmosphere. A capping layer 74 of Indium Tin Oxide (ITO) is grown on top of the third layer 73 with a resistively of 1–50 Ω cm and a thickness of 100 nm to 450 nm. A layer of aluminum of 2000 nm is evaporated on top of the capping layer 74. A top electrical contact mask is photolithographed on the top surface of the aluminum and then etched off to form a top electrical contact 75. Light emission can be obtained from both the top and bottom surface since the substrate is transparent.

Figure 7:
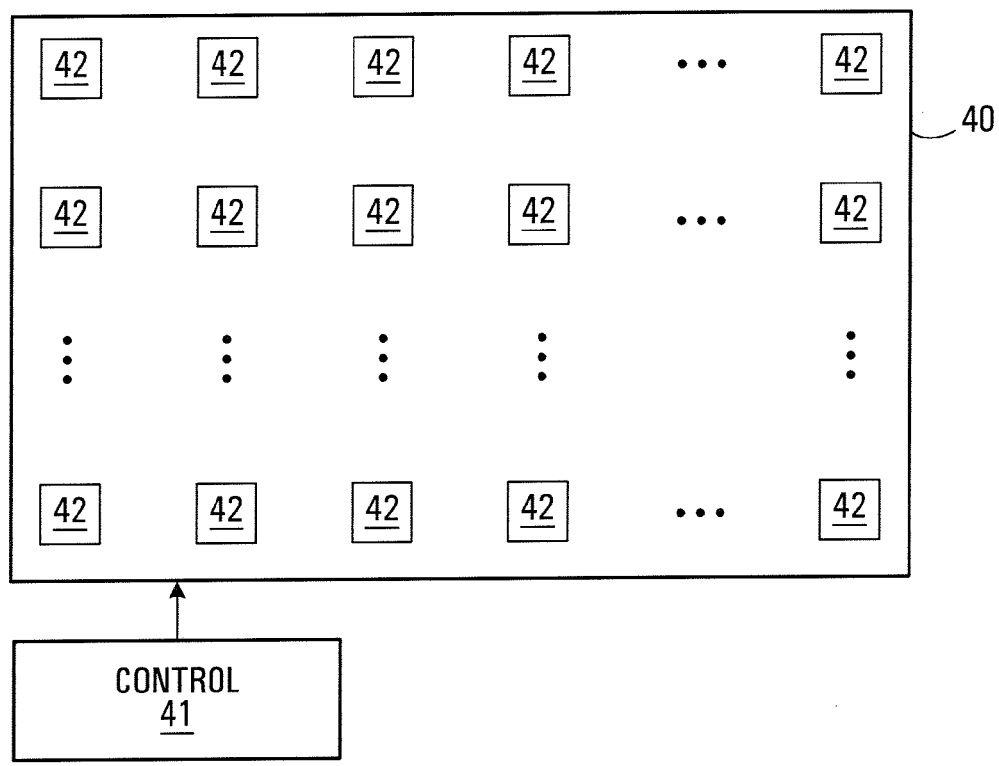
FIG. 7 is a top view of an array of light emitting devices as provided by an embodiment of the invention.

FIG. 7 illustrates the use of white light emitting devices/structures 42 of a type as shown in FIGS. 1 through 6, arranged in an array comprising a regular pattern of such assemblies, as components of a display 40, or alternatively for a back light illumination panel for a structure such as a liquid crystal display. The individual devices/structures 42 may be selectively illuminated, by imposing a desired turn-on voltage across the first and second electrical conductors 16 and 17 (not shown in FIG. 7; see FIG. 3.), to display a message or design in a manner well understood in the art.

Preferably, the selective illumination of the component light emitting devices/structures 42 of the FIG. 7 display is suitably controlled by a controller 41 in response to user input. The individual light emitting devices/structures 42 are connected electrically with suitable electrical circuitry (not shown) in the display 40, in a manner analogous to that used for displays utilizing fluorescent or incandescent lamps.

Alternatively, all of the component light emitting devices/structures 42 may be illuminated simultaneously for back lighting applications such as for an LCD display for example.

The light-emitting assemblies shown in FIGS. 1 to 6 may be made in any suitable size and dimensional character. In application to displays, such light-emitting assemblies will generally be of a size commensurate with the size of fluorescent or incandescent lamps used in similar displays.

Figure 8:
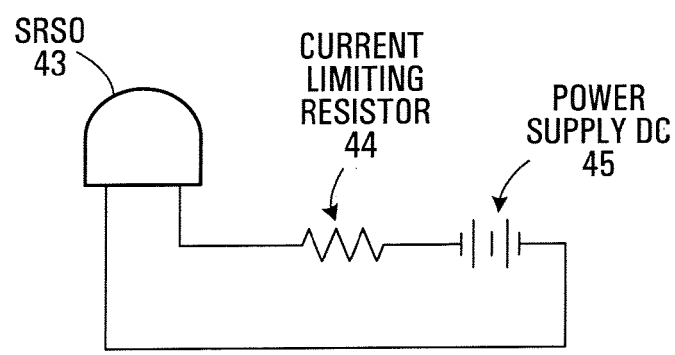
FIG. 8 is a schematic diagram of a light emitting device shown connected within a circuit.

FIG. 8 is a schematic representation of a generalized light emitting assembly provided by an embodiment of the present invention. There is an SRSO light emitting device 43 such as described in a previous embodiment connected to a DC power supply 45 through a current limiting resistor 44. This circuit is a single example of a circuit where the devices/structures may be used. Many other applications exist.

It will be apparent from the foregoing that the light-emitting assemblies of the present invention may be variously configured with a number of solid state light-emitting devices, which allows various colors by using rare-earth doped group IV nanocrystals to be the active luminous medium.

Further, while the invention has been described primarily herein in reference to the generation of white light, it will be apparent that the scope of the invention is not thus limited, but rather extends to and encompasses the production of light of other colors than mixed white light, utilizing solid state primary radiation emitters, of rare-earth doped group IV nanocrystals.

As can be seen from the above discussed examples, in some embodiments there is a conductive substrate and in other embodiments there is a non-conductive substrate. Examples of non-conductive substrates include sapphire, silicon dioxide, AlN, and fuse silica. Examples of conductive substrates include SiC, CaN and ZnO. For embodiments featuring a conductive substrate an additional current injecting layer may not be necessary. On the other hand, for embodiments featuring a non-conductive substrate, preferably a current injecting layer such as ITO or the other examples given above is employed.

In some embodiments, the substrate is transparent and as such preferably a transparent bottom electrode is employed to allow light to exit the device from both the top and bottom. In other embodiments, the substrate is not transparent and as such it is less important to have a transparent electrode on the bottom.

Doped Semiconductor Nanocrystal Layer

Any of the above described embodiments may employ REDGIVN material in the form of a doped semiconductor nanocrystal layer comprising a group IV oxide layer in which is distributed semiconductor nanocrystals. The group IV element used to prepare the layer is preferably selected from silicon, germanium, tin and lead, and the group IV semiconductor oxide layer is more preferably silicon dioxide. The group IV oxide layer preferably has a thickness of from 1 to 2000 nm, for example of from 80 to 2000 nm, from 100 to 250 nm, from 30 to 50 nm, or from 1 to 10 nm.

The semiconductor nanocrystals that are dispersed within the group IV semiconductor oxide layer are preferably the nanocrystal of a group IV semiconductor, e.g. Si or Ge, of a group II-VI semiconductor, e.g. ZnO, ZnS, ZnSe, CaS, CaTe or CaSe, or of a group III-V semiconductor, e.g. GaN, GaP or GaAs. The nanocrystals are preferably from 1 to 10 nm in size, more preferably from 1 to 3 nm in size, and most preferably from 1 to 2 nm in size. Preferably, the nanocrystals are present within the group IV semiconductor oxide layer in a concentration of from 30 to 50 atomic percent, more preferably in a concentration of 37 to 47 atomic percent, and most preferably in a concentration of from 40 to 45 atomic percent.

The one or more rare earth element that is dispersed on the surface of the semiconductor nanocrystal can be selected to be a lanthanide element, such as cerium, prasodymium, neodymium, promethium, gadolinium, erbium, thulium, ytterbium, samarium, dysprosium, terbium, europium, holmium, or lutetium, or it can be selected to be an actinide element, such as thorium. Preferably, the rare earth element is selected from erbium, thulium, and europium. The rare earth element can, for example, take the form of an oxide or of a halogenide. Of the halogenides, rare earth fluorides are preferred as they display more intense fluorescence due to field distortions in the rare earth-fluoride matrix caused by the high electronegativity of fluorine atoms. Most preferably, the rare earth element is selected from erbium oxide, erbium fluoride, thulium oxide, thulium fluoride, europium oxide and europium fluoride.

The one or more rare earth element is preferably present in the group IV semiconductor oxide layer in a concentration of 0.5 to 15 atomic percent, more preferably in a concentration of 5 to 15 atomic percent and most preferably in a concentration of 10 to 15 atomic percent. While such a high concentration of rare earth element has led to important levels of quenching reactions in previous doped semiconductor materials, the doped semiconductor nanocrystal layer of the present invention can accommodate this high concentration as the rare earth element is dispersed on the surface of the semiconductor nanocrystal, which nanocrystal offers a large surface area. The reduced amount of quenching reactions between the rare earth element and the proximity of the rare earth element to the semiconductor nanocrystal provide the basis for a doped semiconductor nanocrystal layer that offers improved optoelectronic properties.

Semiconductor Layer Structure

Figure 11:
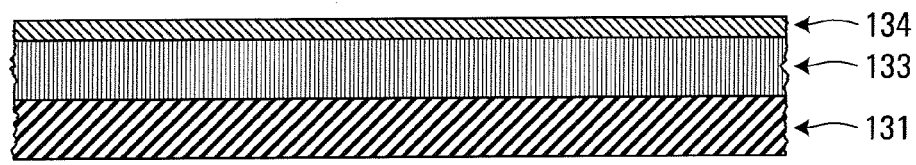
FIG. 11 is a diagram of a semiconductor structure comprising a substrate, a doped semiconductor nanocrystal layer, and a current injection layer.

Using the doped semiconductor nanocrystal layer described above, a multitude of semiconductor structures can be prepared. For example, a semiconductor structure is shown in FIG. 11, in which one or more layers 133 of the doped semiconductor nanocrystal layer are deposited on a substrate 131.

The substrate on which the semiconductor nanocrystal layer is formed is selected so that it is capable of withstanding temperatures of up to 1000° C. Examples of suitable substrates include silicon wafers or poly silicon layers, either of which can be n-doped or p-doped (for example with $1 \times 10^{20}$ to $5 \times 10^{21}$ of dopants per $cm^3$), fused silica, zinc oxide layers, quartz and sapphire substrates. Some of the above substrates can optionally have a thermally grown oxide layer, which oxide layer can be of up to about 2000 nm in thickness, a thickness of 1 to 20 nm being preferred. The thickness of the substrate is not critical, as long as thermal and mechanical stability is retained.

The semiconductor structure can comprise a single or multiple doped semiconductor nanocrystal layers, each layer having an independently selected composition and thickness. By using layers having different rare earth elements, a multi-color emitting structure can be prepared. For example, combining erbium, thulium and europium in a single semiconductor structure provides a structure that can fluoresce at the colors green (erbium), blue (thulium), and red (europium).

When two or more doped semiconductor nanocrystal layers are used in a single semiconductor structure, the layers can optionally be separated by a dielectric layer. Examples of suitable dielectric layers include silicon dioxide, silicon nitride and silicon oxy nitride. The silicon dioxide dielectric layer can also optionally comprise semiconductor nanocrystals. The dielectric layer preferably has a thickness of from 1 to 10 nm, more preferably of 1 to 3 nm and most preferably of about 1.5 nm. The dielectric layer provides an efficient tunnelling barrier, which is important for obtaining high luminosity from the semiconductor structure.

The semiconductor structure can also have an Indium Tin Oxide (ITO) current injection layer (134) overtop the one or more doped semiconductor nanocrystal layers. The ITO layer preferably has a thickness of from 150 to 300 nm. Preferably, the chemical composition and the thickness of the ITO layer is such that the semiconductor structure has a conductance of from 30 to 70 ohms cm.

The thickness of the semiconductor structure is preferably 2000 nm or less, and the thickness will depend on the thickness of the substrate, the number and thickness of the doped semiconductor nanocrystal layers present, the number and the thickness of the optional dielectric layers, and the thickness of the optional ITO layer.

Figure 12:
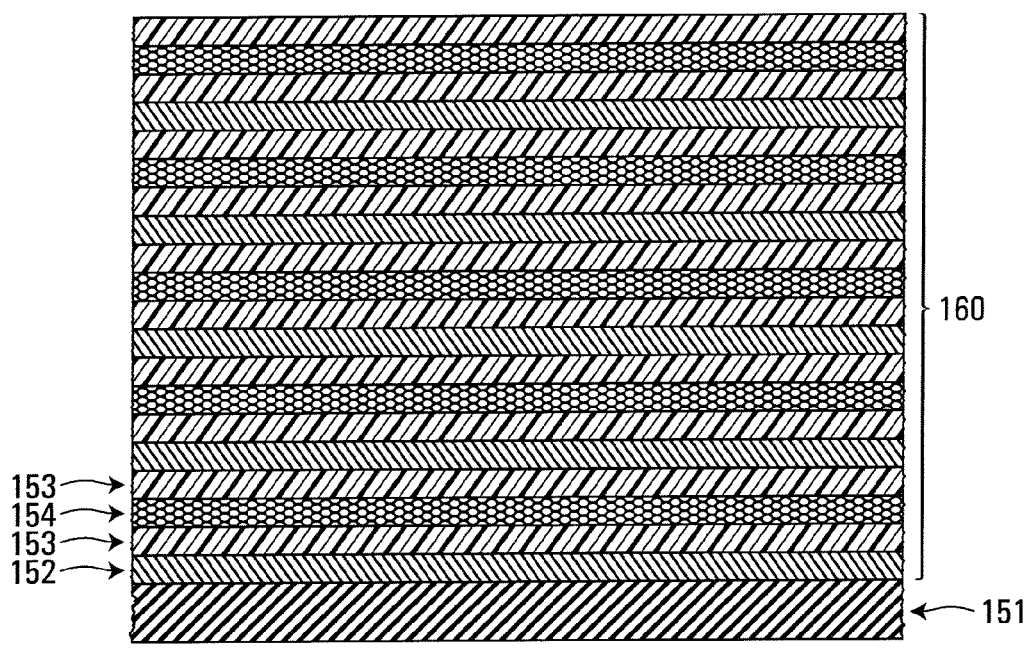
FIG. 12 is a diagram of a superlattice semiconductor structure comprising a substrate and alternating doped semiconductor nanocrystal layers and dielectric layers.

One type of preferred semiconductor structure provided by an embodiment of the present invention is a superlattice structure, shown by way of example in FIG. 12, which structure comprises multiple layers of hetero-material 160 on a substrate 151. Multiple doped semiconductor nanocrystals layers having a thickness of from 1 nm to 10 nm are deposited on the substrate 152 and 154, and the doped semiconductor nanocrystals layers can comprise the same or different rare earth elements. Optionally, the doped semiconductor nanocrystal layers are separated by dielectric layers 153 of about 1.5 nm in thickness, and an ITO current injection layer (not shown) can be deposited on top of the multiple layers of the superlattice structure. There is no maximum thickness for the superlattice structure, although a thickness of from 250 to 2000 nm is preferred and a thickness of from 250 to 750 nm is more preferred.

Preparation of the Doped Semiconductor Nanocrystal Layer

The preparation of the doped semiconductor nanocrystal layer comprises the following two general steps:

(a) the simultaneous deposition of a semiconductor rich group IV oxide layer and of one or more rare earth element; and (b) the annealing of the semiconductor rich group IV oxide layer prepared in (a) to form semiconductor nanocrystals.

The semiconductor rich group IV oxide layer comprises a group IV oxide layer, which group IV oxide is preferably selected from $SiO_2$ or $GeO_2$, in which group IV oxide layer is dispersed a rare earth element and a semiconductor, which semiconductor can be the same as, or different than, the semiconductor that forms the group IV oxide layer.

By "semiconductor rich", it is meant that an excess of semiconductor is present, which excess will coalesce to form nanocrystals when the semiconductor rich group IV oxide layer is annealed. Since the rare earth element is dispersed within the oxide layer when the nanocrystals are formed, the rare earth element becomes dispersed on the surface of the semiconductor nanocrystals upon nanocrystal formation.

Since the semiconductor rich group IV oxide layer and the one or more rare earth element are deposited simultaneously, ion implantation of the rare earth element is avoided. As such, the group IV oxide layer surface is free of the damage associated with an implantation process. Also, since the rare earth element is deposited at the same time as the semiconductor rich group IV oxide layer, the distribution of the rare earth element is substantially constant through the thickness of the group IV oxide layer.

The deposition of the semiconductor rich group IV oxide layer doped with one or more rare earth elements is preferably carried out by Plasma-Enhanced Chemical Vapor Deposition (PECVD) or by Pulse Laser Deposition (PLD). The above two methods each have their respective advantages for preparing the semiconductor rich group IV oxide layer doped with one or more rate earth elements, and the methods are described below.

Pulse Laser Deposition

Pulse laser deposition is advantageous for the deposition of the semiconductor rich group IV oxide layer doped with one or more rare earth elements as it permits the deposition of a wide variety of semiconductors and a wide variety of rare earth elements.

Figure 13:
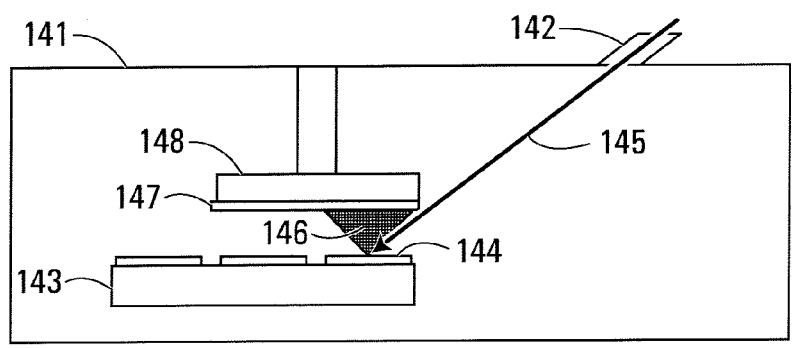
FIG. 13 is a diagram of a Pulse Laser Deposition apparatus.

Referring now to FIG. 13, which shows by way of a diagram a typical set up of a pulse laser deposition apparatus, the pulse laser deposition apparatus consists of a large chamber 141, which can be evacuated down to at least $10^{-7}$ bars or pressurized with up to 1 atmosphere of a gas such as oxygen, nitrogen, helium, argon, hydrogen or combinations thereof. The chamber has at least one optical port 142 in which a pulse laser beam 145 can be injected to the chamber and focused down onto a suitable target 144. The target is usually placed on a carrousel 143 that allows the placement of different target samples into the path of the pulse laser focus beam. The carrousel is controlled so that multiple layers of material can be deposited by the pulse laser ablation of the target. The flux of the focused pulse laser beam is adjusted so that the target ablates approximately 0.1 nm of thickness of material on a substrate 147, which can be held perpendicular to the target and at a distance of 20 to 75 millimetres above the target. This flux for instance is in the range of 0.1 to 20 joules per square cm for 248 nm KrF excimer laser and has a pulse width of 20–45 nanosecond duration. The target can be placed on a scanning platform so that each laser pulse hits a new area on the target, thus giving a fresh surfaces for the ablation process. This helps prevent the generation of large particles, which could be ejected in the ablation plume 146 and deposited on to the substrate. The substrate is usually held on a substrate holder 149, which can be heated from room temperature up to 1000° C. and rotated from 0.1 to 30 RPM depending on the pulse rate of the pulse laser, which in most cases is pulsed between 1–10 Hz. This rotation of the substrate provides a method of generating a uniform film during the deposition process. The laser is pulsed until the desired film thickness is met, which can either be monitored in real time with an optical thickness monitor or quartz crystal microbalance or determined from a calibration run in which the thickness is measured from a given flux and number of pulses. Pulse laser deposition can be used for depositing layers of from 1 to 200 nm in thickness.

For the preparation of a semiconductor rich group IV oxide layer doped with one or more rare earth elements, the target that is ablated is composed of mixture of a powdered group IV binding agent, a powdered semiconductor that will form the nanocrystal, and a powdered rare earth element. The ratio of the various components found in the doped semiconductor nanocrystal layer is decided at this stage by controlling the ratio of the components that form the target.

Preferably, the mixture is placed in a hydraulic press and pressed into a disk of 25 mm diameter and 5 mm thickness with a press pressure of at least 500 Psi while being heated to 700° C. The temperature and pressure can be applied, for example, for one hour under reduced pressure (e.g. $10^{-3}$ bars) for about one hour. The press pressure is then reduced and the resulting target is allowed to cool to room temperature.

The group IV binding agent can be selected to be a group IV oxide (e.g. silicon oxide, germanium oxide, tin oxide or lead oxide), or alternatively, it can be selected to be a group IV element (e.g. silicon, germanium, tin or lead). When the group IV binding agent is a group IV oxide, the binding agent, the semiconductor and the rare earth element are combined to form the target, and the pulse laser deposition is carried out in the presence of any one of the gases listed above. If a group IV element is used as the group IV binding agent instead, the pulse laser deposition is carried out under an oxygen atmosphere, preferably at a pressure of from $1\times10^{-4}$ to $5\times10^{-3}$ bar, to transform some or all of the group IV element into a group IV oxide during the laser deposition process. When the semiconductor element which is, to form the nanocrystals is selected to be a group II-VI semiconductor (e.g. ZnO, ZnS, ZnSe, CaS, CaTe or CaSe) or a group III-V semiconductor (e.g. GaN, GaP or GaAs), the oxygen concentration is kept high to insure that all of the group IV element is fully oxidized. Alternatively, if the nanocrystals to be formed comprise the same group IV semiconductor element that is being used as the binding agent, the oxygen pressure is selected so that only part of the group IV element is oxidized. The remaining non-oxidized group IV element can then coalesce to form nanocrystals when the prepared semiconductor rich group IV oxide layer is annealed.

The powdered rare earth element that is used to form the target is preferably in the form of a rare earth oxide or of a rare earth halogenide. As mentioned above, the rare earth fluoride is the most preferred of the care earth halogenides.

Pulse laser deposition is useful for the subsequent deposition of two or more different layers. Multiple targets can be placed on the carrousel and the pulse laser can be focussed on different targets during the deposition. Using this technique, layers comprising different rare earth elements can be deposited one on top of the other to prepare semiconductor structures as described earlier. Different targets can also be used to deposit a dielectric layer between the semiconductor rich group IV oxide layers, or to deposit a current injection layer on top of the deposited layers. Pulse laser deposition is the preferred method for preparing the superlattice semiconductor structure described above.

Preparation of the semiconductor rich group IV oxide layer doped with one or more rare earth elements can of course be carried out with different pulse laser deposition systems that are known in the art, the above apparatus and process descriptions being provided by way of example.

Plasma Enhanced Chemical Vapor Deposition

PECVD is advantageous for the deposition of the semiconductor rich group IV oxide layer doped with one or more rare earth element, as it permits the rapid deposition of the layer. The thickness of the semiconductor rich group IV oxide layer doped with one or more rare earth element prepared with PECVD is 10 nm or greater, more preferably from 10 to 2000 nm.

Formation of a non-doped types IV semiconductor nanocrystal layer through chemical vapor deposition has been described, for example, by J. Sin, M. Kim, S. Seo, and C. Lee [*Applied Physics Letters*, (1998), Volume 72, 9, 1092–1094], the disclosure of which is hereby incorporated by reference.

In this embodiment, the doped semiconductor nanocrystal layer is prepared by incorporating a rare-earth precursor into the PECVD stream above the receiving heated substrate on which the semiconductor film is grown. PECVD can be used to prepare the doped semiconductor nanocrystal layer where the semiconductor nanocrystal is a silicon or a germanium nanocrystal, and where the rare earth element is a rare earth oxide.

In the PECVD process, a group IV element precursor is mixed with oxygen to obtain a gaseous mixture where there is an atomic excess of the group IV element. An atomic excess is achieved when the ratio of oxygen to group IV element is such that when a group IV dioxide compound is formed, there remains an excess amount of the group IV element. The gaseous mixture is introduced within the plasma stream of the PEVCD instrument, and the silicon and the oxygen are deposited on a substrate as a group IV dioxide layer in which a group IV atomic excess is found. It is this excess amount of the group IV element that coalesces during the annealing step to form the group IV nanocrystal. For example, to prepare a silicon dioxide layer in which silicon nanocrystals is dispersed, a silicon rich silicon oxide (SRSO) layer is deposited on the substrate.

The group IV element precursor can contain, for example, silicon, germanium, tin or lead, of which silicon and germanium are preferred. The precursor itself is preferably a hydride of the above elements. A particularly preferred group IV element precursor is silane ($SiH_4$).

The ratio (Q) of group IV element precursor to oxygen can be selected to be from 3:1 to 1:2. If an excess of group IV element precursor hydride is used, the deposited layer can contain hydrogen, for example up to approximately 10 atomic percent hydrogen. The ratio of the flow rates of the group IV element precursor and of oxygen can be kept, for example, between 2:1 and 1:2.

Also introduced to the plasma stream is a rare earth element precursor, which precursor is also in the gaseous phase. The rare earth precursor is added to the plasma stream at the same time as the group IV element precursor, such that the rare earth element and the group IV element are deposited onto the substrate simultaneously. Introduction of the rare earth precursor as a gaseous mixture provides better dispersion of the rare earth element within the group IV layer. Preferably, presence of oxygen in the plasma stream and in the deposited layer leads to the deposition of the rare earth element in the form of a rare earth oxide.

The rare earth element precursor comprises one or more ligands. The ligand can be neutral, monovalent, divalent or trivalent. Preferably, the ligand is selected so that when it is coordinated with the rare earth element, it provides a compound that is volatile, i.e. that enters the gaseous phase at a fairly low temperature, and without changing the chemical nature of the compound. The ligand also preferably comprises organic components that, upon exposure to the plasma in the PECVD apparatus, will form gaseous by-products that can be removed through gas flow or by reducing the pressure within the PECVD apparatus. When the organic components of the ligand are conducive to producing volatile by-products (e.g. $CO_2$, $O_2$) less organic molecules are incorporated into the deposited layer. Introduction of organic molecules into the deposited layer is generally not beneficial, and the presence of organic molecules is sometimes referred to as semiconductor poisoning.

Suitable ligands for the rare earth element can include acetate functions, for example 2,2,6,6-tetramethyl-3,5-heptanedione, acetylacetonate, flurolacatonate, 6,6,7,7,8,8,8-heptafluoro-2,2-dimethyl-3,5-octanedione, i-propylcyclopentadienyl, cyclopentadienyl, and n-butylcyclopentadienyl. Preferred rare earth metal precursor include tris(2,2,6,6-tetramethyl-3,5-heptanedionato) erbium(III), erbium (III) acetylacetonate hydrate, erbium (III) flurolacetonate, tris(6,6,7,7,8,8,8-heptafluoro-2,2-dimethyl-3,5-octanedionate)erbium (III), tris(i-propylcyclopentadienyl)erbium (III), Tris(cyclopentadienyl)erbium (III), and tris(n-butylcyclopentadienyl)erbium (III). A particularly preferred rare earth element precursor is tris(2,2,6,6-tetramethyl-3,5-heptanedionato) erbium(III) ($Er^{+3}$ [$(CH_3)_3$ $CCOCH=COC(CH_3)_3]_3$), which is also referred to as $Er^{+3}$ $(THMD)_3$.

If the rare earth element precursor is not in the gaseous phase at room temperature, it must be transferred to the gaseous phase, for example, by heating in an oven kept between 80° C. and 110° C. The gaseous rare earth element precursor is then transferred to the plasma stream with an inert carrier gas, such as argon. The gaseous rare earth element precursor is preferably introduced to the plasma at a position that is below a position where the group IV element containing compound is introduced to the plasma. Use can be made of a dispersion mechanism, for example a dispersion ring, to assist in the dispersion of the gaseous rare earth element precursor in the plasma.

In order to obtain a more even deposition of the doped type IV oxide layer, the substrate can be placed on a sceptre that rotates during deposition. A circular rotation of about 3 rpm is suitable for increasing the uniformity of the layer being deposited.

An Electron Cyclotron Resonated (ECR) reactor is suitable for producing the plasma used in the PECVD method described above. ECR is a particular method of generating plasma, where the electrons have a spiral motion caused by a magnetic field, which allows a high density of ions in a low-pressure region. The high ion density with low pressure is beneficial for deposition, as the rare earth metal precursor can be stripped of its organic components and incorporated uniformly and in a high concentration. The plasma used in the PECVD method can comprise, for example, argon, helium, neon or xenon, of which argon is preferred.

The PECVD method is carried out under a reduced pressure, for example $1\times10^{-7}$ torr, and the deposition temperature, microwave power and scepter bias can be kept constant. Suitable temperature, microwave and scepter bias values can be selected to be, for example, 300° C., 400 W and $-200V_{DC}$, respectively.

The semiconductor rich group IV oxide layer doped with one or more rare earth element can be grown at different rates, depending on the parameters used. A suitable growth rate can be selected to be about 60 nm per minute, and the semiconductor rich group IV oxide layer can have a thickness of from 10 to 2000 nm, more preferably of from 100 to 250 nm.

Preparation of the semiconductor rich group TV oxide layer doped with one, or more rare earth elements can of course be carried out with different plasma enhanced chemical vapor deposition systems that are known in the art, the above apparatus and process descriptions being provided by way of example.

Annealing Step

After the semiconductor rich group IV oxide layer doped with one or more rare earth element has been prepared, the doped type IV oxide layer is annealed, optionally under flowing nitrogen ($N_2$), in a Rapid Thermal Anneal (RTA) furnace, at from about 600° C. to about 1000° C., more preferably from 800° C. to 950° C., from 5 minutes to 30 minutes, more preferably from 5 to 6 minutes. It is during the annealing step that the atomic excess of semiconductor is converted into semiconductor nanocrystals.

When PECVD is used to prepare the semiconductor rich group IV oxide layer doped with one ox more rare earth element, the annealing step can also be carried out under an oxygen atmosphere to insure oxidation of the rare earth element, or under a reduced pressure in order to facilitate the removal of any volatile by-products that might be produced.

The amount of excess semiconductor in the group IV oxide layer and the anneal temperature dictate the size and the density of the semiconductor nanocrystal present in the final doped semiconductor nanocrystal layer.

Since the rare earth element is well dispersed through the deposited group IV semiconductor oxide layer, when the nanocrystals are formed during the annealing step, the rare earth element becomes localised on the surface of the nanocrystals. Since the nanocrystals provide a large surface area on which the rare earth element can be dispersed, the concentration of the rare earth element can be quite elevated, while retaining good photoelectronic properties.

The above described PECVD method has assumed silicon nanocrystals are produced. More generally, other types of group IV nanocrystals may be produced. Examples of other group IV nanocrystals include silicon carbide, germanium, germanium carbide, tin, tin oxide and lead.

Doped Semiconductor Powder

The present invention also teaches the simple manufacturing of a doped semiconductor powder, which semiconductor powder comprises nanocrystals of a group IV semiconductor and a rare earth element. Such a powder can be embedded in a layer for use in any of the above described embodiments.

The doped semiconductor powder comprises as a major component nanocrystals of a group IV semiconductor. The group IV semiconductor can be selected, e.g., from silicon, germanium, tin or lead, of which silicon and germanium are preferred. Combinations of these semiconductors can also be used, as well as multi-element semiconductors that comprise the above semiconductors. Preferably, the nanocrystals have an average diameter of from 0.5 to 10 nm, for example of about 3 nm.

The rare earth element that is dispersed on the surface of the semiconductor nanocrystals is preferably selected from cerium, prasodymium, neodymium, promethium, gadolinium, erbium, thulium, ytterbium, samarium, dysprosium, terbium, europium, holmium, lutetium, and thorium, of which erbium, thulium and europium are most preferred. The rare earth element is preferably in the form of a complex comprising a rare earth and one or more ligands. The nature of the one or more ligands is dictated by the process used to prepare the doped semiconductor powder. The doped semiconductor powders of the invention can also comprise more than a single rare earth element.

Since the rare earth element is dispersed on the surface of the groups IV semiconductor nanocrystal, reduced photoactivity due to aggregation of the rare earth element is reduced. The concentration of the rare earth element in the doped semiconductor powder is preferably from 0.5 to 10 atomic percent, more preferably from 0.5 to 5 atomic percent, and most preferably from 0.5 to 2 atomic percent. The atomic percent values are calculated on the basis of the number of rare earth atoms relative the total number of atoms in the doped semiconductor powder.

Gas Pyrolysis

A gas pyrolysis process can be utilised to prepare the doped semiconductor powder of the invention. In this process, a group IV semiconductor precursor and a rare earth element complex are mixed in the gaseous phase, and the mixture is first heated, and then cooled to obtain the desired product. The gas pyrolysis reaction consists of the thermal treatment of a gaseous group IV element, in the presence of a gaseous rare earth element, to such a temperature that the gaseous group IV element forms a nanocrystal. When the formed nanocrystal is cooled down in the presence of a rare earth element, the rare earth element goes form the gaseous state to the solid state and it deposits itself on the surface of the nanocrystal.

Figure 14:
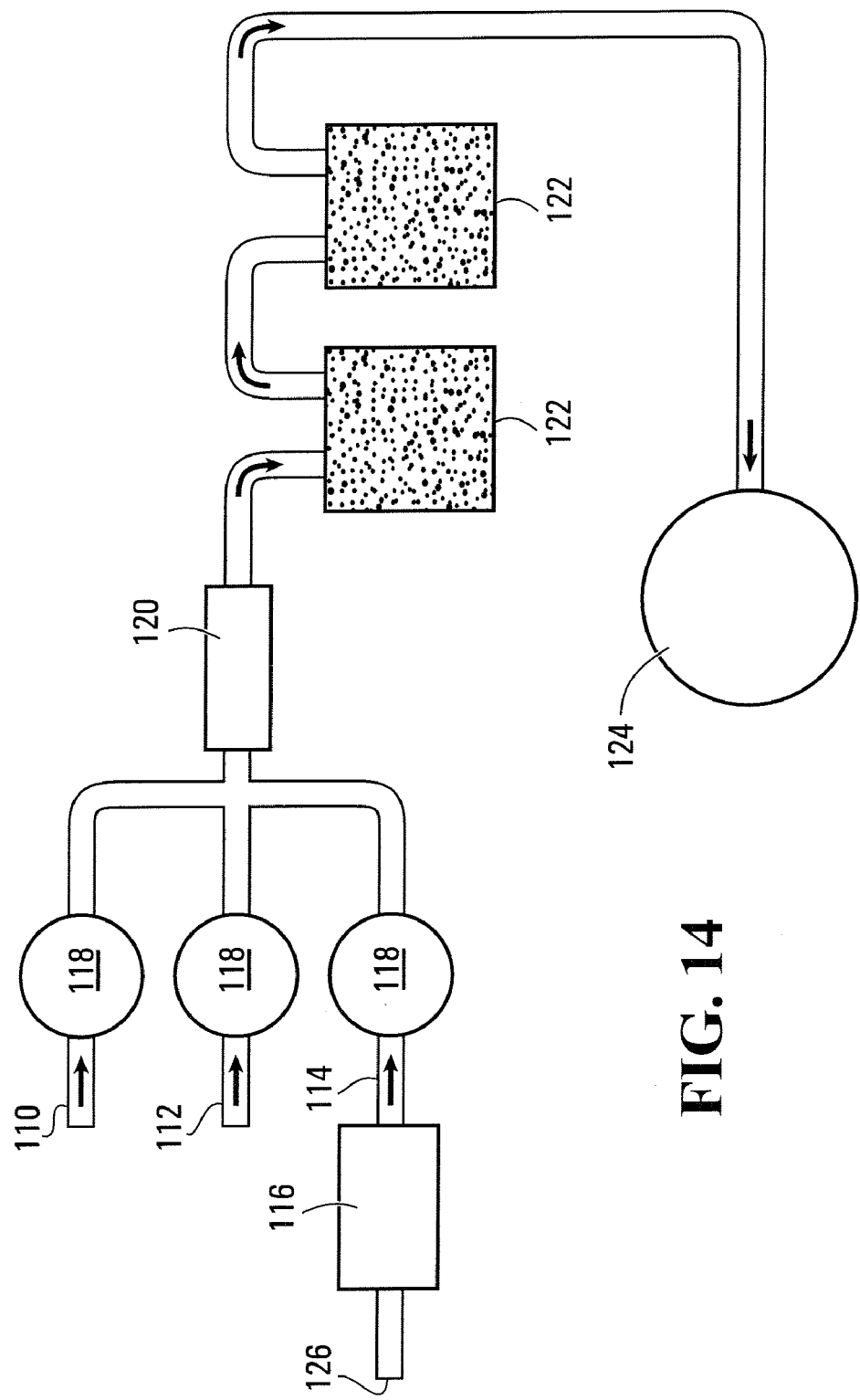
FIG. 14 displays a schematic of a gas pyrolysis apparatus suitable for the production (of a group IV semiconductor powder doped with a rare earth element.

Gas pyrolysis can be carried out, for example, in a gas pyrolysis apparatus, a schematic of which is provided in FIG. 14. In the apparatus shown in FIG. 11, a carrier gas, a gaseous group IV semiconductor precursor and a gaseous rare earth element complex are introduced via entry ports 110, 112 and 114. The carrier gas is preferably an inert gas, such as argon.

As the group IV semiconductor is in the gaseous phase during reaction, a group IV semiconductor precursor is used. The group IV semiconductor precursor is chosen so that the precursor is volatile at room temperature, or so that it can be volatilized at a fairly low temperatures, e.g., from 80 to 120° C. Preferably, the group IV semiconductor precursor is selected so that the by-products obtained after nanocrystal formation are themselves volatile compounds that will be removed with the gas flow. The group IV semiconductor is preferably selected from silicon, germanium, tin or lead, of which silicon and germanium are preferred. The precursor is preferably a hydride of the above elements. A particularly preferred group IV semiconductor precursor is silane ($SiH_4$).

Similarly, as the rare earth element is in the gaseous phase during reaction, a rare earth element complex that is volatile or that can be volatilized is used. The rare earth element complex comprises one or more ligands, which ligands can be neutral, monovalent, divalent or trivalent. Preferably, the ligand is selected so that when it is coordinated with the rare earth element, it provides a compound that is volatile, i.e. that enters the gaseous phase at a fairly low temperature, and without changing the chemical nature of the compound. Suitable ligands for the rare earth element complex include acetate functions, for example 2,2,6,6-tetramethyl-3,5-heptanedione, acetylacetonate, flurolacetonate, 6,6,7,7,8,8,8-heptafluoro-2,2-dimethyl-3,5-octanedione, i-propylcyclopentadienyl, cyclopentadienyl, and n-butylcyclopentadienyl. Preferred rare earth element complex include tris(2,2,6,6-tetramethyl-3,5-heptanedionato) erbium(III), erbium (III) acetylacetonate hydrate, erbium (III) flurolacetonate, tris(6,6,7,7,8,8,8-heptafluoro-2,2-dimethyl-3,5-octanedionate)erbium (III), tris(i-propylcyclopentadienyl)erbium (III), Tris(cyclopentadienyl)erbium (III), and tris(n-butylcyclopentadienypl)erbium (III). A particularly preferred rare earth element complex is tris(2,2,6,6-tetramethyl-3,5-heptanedionato) erbium(III), which is also referred to as $Er^{+3}(THMD)_3$.

When the rare earth element complex or the group IV semiconductor precursor are not volatile at room temperature, use can be made of a temperature-controlled oven 116 to bring the precursor or complex into the gaseous phase. The temperature controlled oven, which can be kept. E.g., between 110° C. and 120° C., controls the concentration of rare earth metal that is present in the gaseous phase. The temperature control oven can be fitted with a carrier gas inlet 126 to transfer the gaseous rare earth element complex to the furnace through the mass-flow controllers 118.

The ratio of the carrier gas, the group IV semiconductor precursor and the rare earth element complex is controlled by mass-flow controllers 138, which control the introduction of each gaseous component in the apparatus. The flow of the combined three mass-flow controllers is controlled to obtain a flow through the furnace that is preferably between 20 and 30 standard cubic centimetres per minute. The flow through the apparatus can be assisted with a mechanical vacuum pump 24 at the end of the gas pyrolysis apparatus.

Once introduced in the apparatus, the gaseous components flow into a short, temperature controlled furnace 120 (also referred to as a flow-through furnace). The flow-through furnace 120 is preferably a small tubular furnace having a length between 3 cm and 9 cm, the furnace being temperature controlled to be at a temperature where the gaseous group IV semiconductor precursor reacts to form nanocrystals. Temperatures of front 600° C. to 1000° C. have been found to be suitable for carrying out this reaction, although specific temperatures, which may be within or outside of this range, can be determined by non-inventive experimentation. Heating of the furnace can be carried out by any suitable method, such as electric heating or microwave heating. The tubular furnace can have an inside diameter that ranges, for example, from 6 to 20 mm, with an inside diameter of 12 mm being preferred. Selection of the length of the furnace, its inside diameter and the furnace temperature can be used to control the size of the nanocrystals obtained, as these parameters control the thermodynamics of the system. The parameters can be monitored so as to permit computer control of the gas pyrolysis process.

As the group IV semiconductor precursor and the rare earth element complex are heated in the furnace, the group IV semiconductor precursor forms semiconductor nanocrystals, and the rare earth element complex deposits on the surface of the nanocrystals when the gaseous stream is cooled. The deposited rare earth element complex is preferably not part of the nanocrystal lattice but is deposited principally on the surface of the nanocrystals. The organic components are preferably transformed into gaseous by-products that are removed along with the carrier gas.

The gaseous stream containing the doped semiconductor nanocrystals can be allowed to cool within a cooling zone (not shown). The cooling zone can be from 10 cm to a few meters, and active cooling methods, such as mechanical refrigeration, an acetone/dry ice environment or a liquid nitrogen environment can be utilised.

The prepared doped semiconductor nanocrystals are then recovered from the carrier gas, for example by passing the carrier gas through one or more bubblers 122 that contain a solvent, such as ethylene glycol, in which the doped semiconductor nanocrystals display some solubility, The solvent can then removed from the bubblers and is vacuum dried to recover the doped type IV semiconductor nanocrystals.

Solution Saturation

A second method for preparing the doped semiconductor powder of the invention uses solution oversaturation of the rare earth element to deposit the rare earth element onto the nanocrystal surface. In this method, a solution comprising an undoped group IV semiconductor nanocrystal powder, a rare earth element complex and a solvent which is a good solvent for the rare earth element complex and a poor solvent for the undoped group IV semiconductor nanocrystal powder is heated to dissolve the rare earth element complex. Upon cooling of the solution, the solution becomes oversaturated with the rare earth element complex and the complex precipitates from solution to be deposited on the surface of the group IV semiconductor nanocrystals.

By "good solvent" is meant a solvent in which the rare earth complex is poorly soluble at low temperature, e.g. room temperature, but in which the rare earth complex is well dissolved at higher temperature. By "poor" solvent is meant a solvent in which the undoped group IV semiconductor nanocrystal powder displays little or no solubility, at both low and high temperatures. Examples of suitable solvent include ethanol, ethylene glycol, toluene, and benzene.

The first step of this process requires the preparation of an undoped group IV semiconductor nanocrystal powder, which preparation can be effected, for example, by (A) solution chemistry or (B) gas pyrolysis.

(A) Solution Chemistry:

In the solution chemistry process, two complementary semiconductor complexes are combined to form the semiconductor nanocrystal and a salt, which nanocrystal and salt are subsequently separated. The undoped semiconductor nanocrystals are prepared by mixing a group IV semiconductor salt, such as a magnesium, sodium or iodine salt of silicon or germanium, with a halogenated group IV semiconductor compound such as silicon or germanium tetrachloride. The mixture is solubilised in a suitable solvent, for example ethylene glycol or hexane, and the mixture is refluxed. Filtration or centrifugation can be used to remove any insoluble salts formed, and the semiconductor nanocrystals are formed upon cooling of the solution.

The process for preparing the undoped semiconductor nanocrystal is preferably carried out in an inert atmosphere, and the reaction vessel used must be inert to the presence of silicon, such as a Teflon vessel, or a silonated glass vessel.

(B) Gas Pyrolysis

The gas pyrolysis process used to prepare the undoped group IV semiconductor nanocrystal powder is similar to the gas pyrolysis process described above for preparing doped semiconductor powders, but where the gaseous rare earth element complex is omitted.

Preparation of the doped type IV semiconductor nanocrystals is achieved by mixing undoped nanocrystals and a rare earth complex in a solvent which is a good solvent for the rare complex and a poor solvent for the type IV semiconductor nanocrystals, for example ethanol. Suitable rare earth complexes include, for example, erbium acetate hydrate and erbium (III) acetylacetonate hydrate. The heterogeneous mixture can be refluxed, for example, for about 90 to about 180 minutes, after which time the solution is cooled to obtain the doped nanocrystals. As the solution cools, the rare earth element complex precipitates out of solution and it deposits on the surface of the nanocrystals in the solution. The rare earth element that is deposited on the surface of the nanocrystal is in the form of a rare earth element complex.

Materials Comprising Doped Semiconductor Powders

An important advantage of the doped semiconductor powder over the doped layers traditionally prepared is that the doped semiconductor powder above can be incorporated into a variety of different hosts, and that these hosts can represent a liquid or a solid phase. The host or matrix is preferably chosen so that it does not interfere with the photoluminescence of the doped nanocrystals.

Examples of a suitable host or support matrix for the doped semiconductor powders of the invention include, for example, polymers, silica sol-gels, and spin-on-glass (SOG). Spin-on-glass can be comprised, for example, of a mixture of silicates that are dissolved in alcohol. Examples of suitable polymers include, for example, poly(2-methoxy-5-(2-ethyl-hexyloxy)-1,4-phenylene-vinylene) (PPV), polymethylmethacrylate (PMMA), and polyphenylene ether (PTE). When the host or support matrix is in a liquid or semi-liquid state, the doped semiconductor powder can be formed into specific shapes or patterns. These specific shapes can include layers that are prepared by spin-coating a liquid solution comprising the doped semiconductor powder. Patterns can also be prepared by combining a liquid polymer comprising the doped semiconductor powder with printing technology such as ink jet technology.

Another advantage of the doped semiconductor powder over the doped layers rests in the fact that they can be used to prepare thicker layers. It also allows the combination of different nanocrystal types to form hybrid systems, such as $Si_{nc}+PbS$ or $Si_{nc}+CdS$.

The materials comprising doped semiconductor powders of the invention also have the advantage that the components of the materials, such as the host or support matrix, and any additional components such as a base substrate, are not required to be resistant to high temperatures. In traditional doped layer processes, the nanocrystals are formed by the high temperature annealing of amorphous silicon clusters, which requires that the other components present during annealing, such as the substrates, be temperature resistant. Components that are not temperature resistant can be used with the doped semiconductor powders of the invention, as the nanocrystals are formed prior to being incorporated in the materials.

However, when the components used to prepare the materials comprising semiconductor nanocrystal powders are temperature resistant, the materials can be subsequently annealed. This can prove beneficial for the preparation, for example, of semiconductor layers comprising semiconductor nanocrystals and a rare earth element. For example, a doped semiconductor powder of the invention can be incorporated into a silica sol-gel, which silica sol-gel is then formed into a layer. Annealing the sol-gel/nanocrystal powder mixture leads to the removal of the organic components of the mixture, leaving a silicon oxide layer in which the doped semiconductor nanocrystal powder is dispersed. Annealing can be carried out, for example, in a Rapid Thermal Anneal (RTA) furnace at from about 600° C. to about 1000° C. The annealing process can be carried out under an oxygen atmosphere to insure the removal of the organic components, and to promote the oxidation of the rare earth element. The annealing step can also be carried out under a reduced pressure in order to facilitate the removal of any volatile organic by-products that might be produced.

Examples of devices that can be prepared with the materials comprising doped semiconductor powders include, for example, optical amplifiers, lasers, optical displays, optical planar circuits, and organic light emitting diodes (OLED).

The following examples are offered by way of illustration and not by way of limitation.

EXAMPLES

Example 1

Silane ($SiH_4$) and Oxygen ($O_2$) are added to an argon plasma stream produced by an Electron Cyclotron Resonated (ECR) reactor via dispersion ring. The ratio (Q) of silane to oxygen has been varied between 3:1, 1.7:1, 1.2:1, 1:1.9, and 1:2. An erbium precursor (Tris(2,2,6,6-tetramethyl-3,5-heptanedionato) erbium(III) [$Er^{+3}(TBMD)_3$]) is placed in a stainless steel oven held between 90 and 110° C.

A carrier gas of Ar is used to transport the Er precursor from the oven through a precision controlled mass-flow controller to a dispersion ring below the Silane injector and above the heated substrate. The instrument pressure is kept at about $1 \times 10^{-7}$ torr. The substrates used are either fuse silica or silicon wafers on which is thermally grown an oxide layer of 2000 nm thickness. The deposition temperature, the microwave power and the sceptre bias are kept constant at 300° C., 400 W and $-200V_{DC}$. The $SiH_4$, Ar flow rates were adjusted while keeping the $O_2$ flow rate at 20 militorr $sec^{-1}$ for the various excess silicon content. The Er/Ar flow rate was adjusted to the vapor pressure generated by the temperature controlled oven for the desired erbium concentration. The film is grown at a rate of 60 nm per minute and thickness has been grown from 250 nm to 2000 nm thick. The scepter was rotated at 3 rpm during the growth to help in uniformity of film. After deposition, the samples are annealed at 950° C.–1000° C. for 5–6 minutes under flowing nitrogen ($N_2$) in a Rapid Thermal Anneal (RTA) furnace.

Example 2

An ablation target is fabricated by combining powdered silicon, powdered silicon dioxide and powdered erbium oxide, the prepared powder mixture comprising 45% silicon, 35% silicon oxide and 20% erbium oxide. Each powder component has a size of about 300 mesh. The mixture is placed into a ball mill and ground for approximately 5 to 10 minutes. The mixture is then placed into a 25 mm diameter by 7 mm thick mould, placed into a hydraulic press, and compressed for 15 minutes at 500 psi. The obtained target is then placed into an annealing furnace and heated to 1200° C. in a forming gas atmosphere of 5% $H_2$ and 95% $N_2$ for 30 minutes. The Target is cooled down to room temperature and then reground in a ball mill for ten minutes. The mixture is then again placed in a mould, compressed and annealed as described above. The obtained target is placed onto a target holder inside a vacuum chamber. A silicon substrate [n-type, <110> single crystal, 0.1–0.5 Ωcm conductivity] of 50 mm diameter and 0.4 cm thickness is placed on a substrate holder parallel to and at a distance of 5.0 cm above the surface of the target. The substrate is placed onto a substrate support that is heated at 500° C., and the substrate is rotated at a rate of 3 rpm during the deposition. The vacuum chamber is evacuated to a base pressure of $1 \times 10^{-7}$ torr and then back filled with $20 \times 10^{-3}$ torr of Ar. An excimer laser (KrF 248 nm) is focused on to the target at an energy density of about 10 $Jcm^{-2}$ and at a glancing angle of 40° to the vertical axis, such that a 0.1 nm film is generated per pulse. The target is rotated at 5 rpm during deposition in order to have a fresh target surface for each ablation pulse. After a 100 nm layer is deposited on the substrate, the newly deposited film is annealed at temperature of from 900° C. to 950° C. for 5 minutes to form silicon nanocrystals in the Silicon Rich Silicon Oxide (SRSO).

The substrate is reintroduced in the vacuum chamber, and the target is replaced with an Indium Tin Oxide (ITO) target. The atmosphere inside the vacuum chamber is set to $2 \times 10^{-3}$ torr of $O_2$, and the substrate is heated to 500° C. and rotated at 3 rpm. A 100 nm ITO layer is deposited on top of the annealed rare earth doped SRSO file.

Example 3

A gas pyrolysis apparatus was; fitted with a small tubular furnace having a length of 3 cm and an interior diameter of 12 mm. While the furnace temperature was held between 900 and 950° C., an argon carrier gas, silane ($SiH_4$), and $Er_{+3}(THMD)_3$ were introduced to the furnace by way of precision mass-flow controllers. The $Er^{+3}$ $(THMD)_3$ was transferred to the gaseous phase through the use of a temperature controlled oven. The flow through the apparatus was assisted by a mechanical vacuum pump at the end of the apparatus. Once through the furnace, the gaseous stream was allowed to pass through a cooling zone and then to pass through a two-stage bubbler of ethylene glycol. The ethylene glycol solution was removed from the bubbler and it was vacuum dried to cover Er doped Si nanocrystals having an average diameter of about 3 nm.

Example 4

A doped semiconductor powder was prepared through a saturated solution process. The process was carried out in an inert atmosphere glove box, and the glassware used was first silonated by washing for one hour in a 2% toluene solution of $(CH_3)_2SiCl_2$, followed by repeated washes with hexane and methanol.

400 mg of magnesium silicide (MgSi) was added to 100 ml of dried ethylene glycol, stirred and refluxed for 12 hours in a glove box. 3 ml of $SiCl_4$ was added, and the mixture was again refluxed for another 12 hours. After this time, the mixture was filtered, cooled and dried under vacuum. 100 ml of ethanol was added to the dried Si nanocrystals, and 230 mg of dehydrated erbium acetate was added to the solution while stirring, followed by a 3 hour reflux. Upon cooling, the Er doped Si nanocrystals were obtained.

Figure 9:
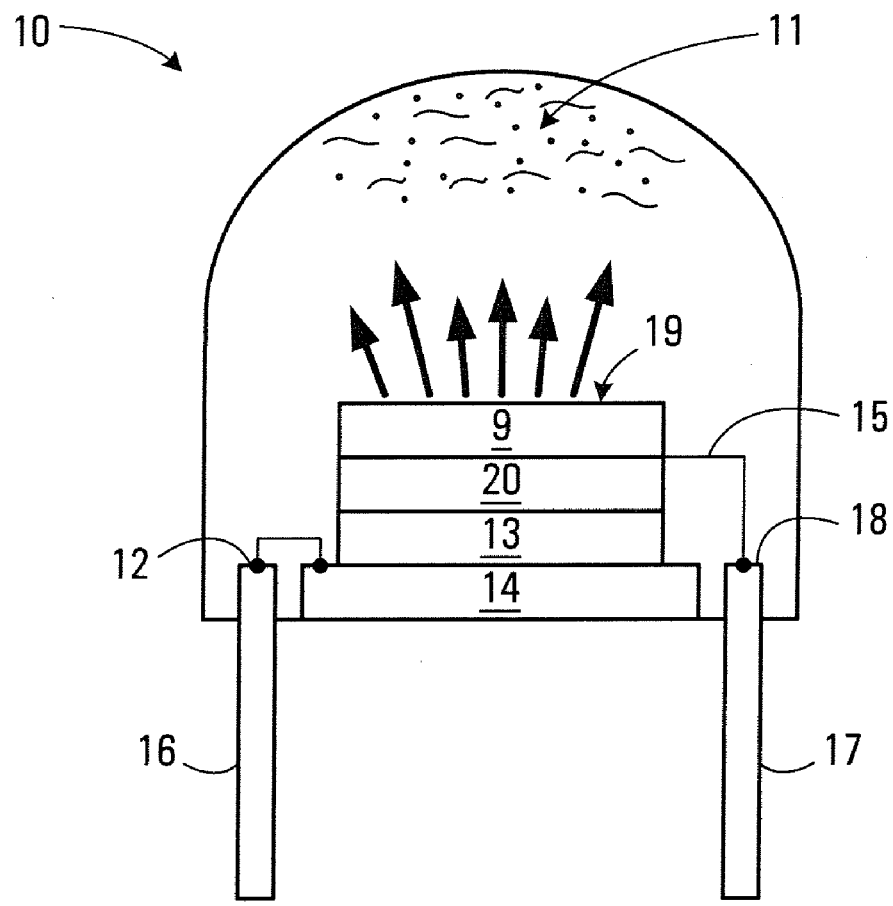
FIG. 9 is a schematic diagram of another light emitting diode provided by an embodiment of the invention.

In another embodiment, an arrangement similar to that of FIG. 1 is employed as shown in FIG. 9 where like elements have been labelled similarly. In this embodiment, there is an additional layer 9. Layer 9 contains one or more of a variety of nanocrystals that are either of group II-VI or III-V elements such as zinc or cadmium base sulfide or selenium such as ZnS, CdS or ZnSe, CdSe and whose size determines the color that it fluoresces at, or group III-V elements such as GaN, InP or GaP. As an example CdSe nanocrystal fluoresces at 535, 560, 590, 610 and 640 nm with a size range of 2 to 10 nm for these wavelengths. These nanocrystals may for example be incorporated in a transparent polymer and applied to the top of the rare earth doped SRSO layer 13 so that it fluoresces the rest of the required wavelengths to make white light. The top electrical contact 20 is at the interface of layer 13 and new layer 9. Interconnect 15 connects lead 17 to the electrical contact 20. In this embodiment, layer 13 is a doped SRSO film which is doped with a rare earth element to produce a primary radiation which behaves as a pump source for layer 9. For example, it might be doped with a rare earth element such as gadolinium Gd or samarium Sm or other rare earth that would emit either in the blue or ultraviolet region of the spectra. This pump energy (photons) then excites the top layer 9 as described above.

Figure 10:
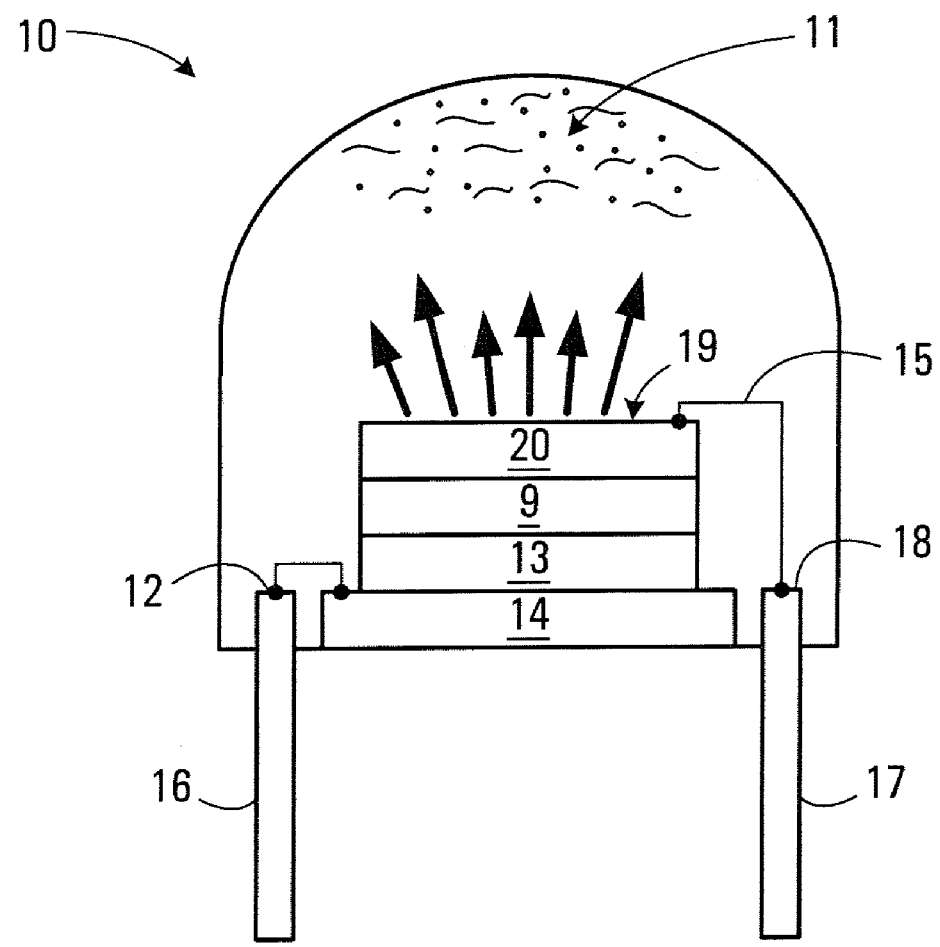
FIG. 10 is a schematic diagram of another light emitting diode provided by an embodiment of the invention.

Another embodiment is provided that is similar to the arrangement of FIG. 9 with the exception that the top electrical contact is on top of the new layer 9. This is shown in FIG. 10 where the same reference numbers have again been used. The top electrical contact 20 is shown on top of layer 9. Interconnect 15 connects lead 17 to the electrical contact 20. In this embodiment, both photon down conversion and electrical excitation would be used to cause the group II-VI or III-V nanocrystals of layer 9 such as ZnS, CdS, ZnSe or CdSe to fluoresce. As an example CdSe nanocrystal fluoresces at 535, 560, 590, 610 and 640 nm with a size range of 2 to 10 nm for these wavelengths. These nanocrystals may be incorporated in a transparent conductive polymer such as poly vinyl alene (PVA) and applied to the top of the rare earth doped SRSO layer so that it would fluoresce the rest of the required wavelengths to make white light by both the electrical current and photon excitation from the layer 13. This provides a hybrid Light Emitting Device that uses both electrical and photon energy to drive the nanocrystal polymer.

For white Light implementations, the layer containing the group II-VI or III-V nanocrystals may consist of a single layer containing multiple types of nanocrystals which combine to produce white light. Alternatively, several layers each containing respective types of group II-VI or III-V nanocrystal may be provided each producing a respective wavelength such that the wavelengths combine to produce white light.

In some embodiments, primary radiation produced by the at least one layer containing REDGIVN is down-converted by the at least one layer of group II-VI or III-V nanocrystals to at least two distinct and separable regions of red and/or green and/or blue light, with said at least two regions of red and/or green and/or blue light mixing to produce a different colored output.

In some embodiments, primary radiation produced by the at least one layer containing REDGIVN is down-converted by the at least one layer of group II or VI nanocrystals to between 2 and 10 distinct and separable regions of white light and light of the color hue red, green or blue light.

While the invention has been described with reference to various illustrative embodiments, features, aspects, and modifications, it will be apparent that the invention may be widely varied in its construction and mode of operation, within the spirit and scope of the invention as hereinafter claimed.

The invention claimed is:

1. A light emitting device comprising:
   at least one single-die semiconductor light-emitting device coupleable with a power supply to emit visible light, the light-emitting device comprising:
      a substrate; and
      a plurality of layers of rare-earth doped group IV nanocrystal material (REGIVN);
      wherein each layer comprises a different rare earth dopant for collectively emitting a visible light output when energized.

2. The light emitting device of claim 1 wherein the visible light is a white light.

3. The light emitting device of claim 1 wherein the REGIVN is a silicon or silicon carbide nanocrystal material.

4. The light emitting device of claim 1, wherein at least one layer comprises a respective rare earth dopant for each of red, blue and green.

5. The light emitting device of claim 1, wherein the plurality of layers comprises three layers with each layer containing a respective rare earth dopant for one of red, blue and green.

6. The light emitting device of claim 1, wherein the plurality of layers comprises three layers with each layer containing a respective rare earth dopant.

7. The light emitting device of claim 5 wherein the three layers are stacked on top of each other.

8. The light emitting device of claim 5 wherein the three layers are arranged adjacent to each other.

9. The light emitting device of claim 1, wherein said plurality of layers comprises:
   a first layer doped with a group IV dopant selected from a group consisting of erbium, terbium and yttrium to provide green light;
   a second layer doped with a group IV dopant selected from a group consisting of thulium and cerium to provide blue light; and
   a third layer doped with a group IV dopant selected from a group consisting of europium and prasodymium to provide red light.

10. The light emitting device of claim 1, wherein said plurality of layers comprises:
    a first layer doped with erbium to provide green and blue light; and
    a second undoped layer of silicon nanocrystal material to provide red light.

11. The light emitting device of claim 1, wherein said plurality of layers comprises:
    a first layer doped with erbium to provide green and blue light; and
    a second layer doped with a group IV dopant selected from a group consisting of europium and prasodymium to provide red light.

12. The light emitting device of claim 1 further comprising a first electrode and a second transparent electrode across which a power supply signal can be applied to energize the light emitting device.

13. The light emitting device of claim 12 wherein the first electrode is a transparent conductive oxide electrode or semitransparent metal electrode.

14. The light emitting device of claim 1, wherein the substrate is a conductive substrate.

15. The light emitting device of claim 14 wherein the substrate is made of a material selected from a group consisting of SiC, GaN and ZnO.

16. The light emitting device of claim 1, wherein the substrate is a substantially non-conductive substrate.

17. The light emitting device of claim 16 wherein the substrate is made of a material selected from a group consisting of sapphire, silicon dioxide, fuse silica and AlN.

18. The light emitting device of claim 1, further comprising a housing member formed of a light-transmissive material, said housing member defining therewithin an interior volume.

19. The light emitting device of claim 18 further comprising first and second electrical contacts extending through said housing member and coupleable to a power supply which is constructed and arranged for imposing a voltage on said light emitting device, to induce emission of said white light.

20. An array of light emitting devices according to claim 1 and a user-responsive controller for selectively illuminating specific ones of said light-emitting devices.

21. A light emitting device according to claim 1 further comprising:
    group II-VI or III-V nanocrystal material arranged to receive light emitted by the rare earth doped group IV nanocrystal material as a pump light source, the group II-VI or III-V nanocrystals fluorescing at a plurality of wavelengths when energized by the pump light source.

22. A light emitting device according to claim 21, comprising:
at least one layer of group II-VI or III-V nanocrystals arranged to receive light emitted by the at least one layer containing rare earth doped group IV nanocrystal material as a pump light source, the group II-VI or III-V nanocrystals fluorescing at a plurality of wavelengths when energized by the pump light source.

23. A light emitting device according to claim 22 wherein the group II-VI or III-V nanocrystals are selected from a group consisting of ZnS, CdS, ZnSe, CdSe, GaN, InP and GaP.

24. A light emitting device according to claim 22 wherein the plurality of wavelengths collectively produce white light.

25. A light emitting device according to claim 22, further comprising a top electrical contact layer wherein the layers are arranged in sequence as follows:
the substrate;
the at least one layer containing rare earth doped group IV nanocrystal material;
the top electrical contact layer; and
the at least one layer containing group II or VI nanocrystals;
wherein the at least one layer containing group II or VI nanocrystals uses photon energy to drive the nanocrystals.

26. A light emitting device according to claim 22, further comprising a top electrical contact layer, the layers arranged in sequence as follows:
the substrate;
the at least one layer containing rare earth doped group IV nanocrystal material;
the at least one layer containing group II or VI nanocrystals; and
the top electrical contact layer;
wherein the at least one layer containing group II or VI nanocrystals uses both electrical energy and photon energy to drive the nanocrystals.

27. A light-emitting device according to claim 1, wherein said device has a multi-layer structure comprising layers selected from the group consisting of nanocrystals of group IV, II-VI and III-V.

28. A light-emitting device according to claim 22, wherein primary radiation produced by the plurality of layers containing REDGIVN is down-converted by the at least one layer of group II-VI or III-V nanocrystals to at least two distinct and separable regions of red and/or green and/or blue light, with said at least two regions of red and/or green and/or blue light mixing to produce a different colored output.

29. A light-emitting device according to claim 22, wherein primary radiation produced by the plurality of layers containing REDGIVN is down-converted by the at least one layer of group II or VI nanocrystals to between 2 and 10 distinct and separable regions of white light and light of the color hue red, green or blue light.

30. A liquid crystal display comprising:
a backlight member including a multiplicity of light-emitting devices in accordance with claim 1.

31. The LCD of claim 30, further comprising:
at least one layer of group II or VI nanocrystals arranged to receive light emitted by the plurality of layers containing rare earth doped group IV nanocrystal material as a pump light source, the group II or VI nanocrystals fluorescing at a plurality of wavelengths when energized by the pump light source.

32. A display, comprising:
a viewable panel including a multiplicity of light-emitting devices, each light-emitting device comprising;
at least one single-die semiconductor light-emitting device in accordance with claim 1.

33. The display of claim 32, wherein each said at least one single-die semiconductor light-emitting device further comprises;
at least one layer of group II or VI nanocrystals arranged to receive light emitted by the plurality of layers containing rare earth doped group IV nanocrystal material as a pump light source, the group II or VI nanocrystals fluorescing at a plurality of wavelengths when energized by the pump light source.

34. A light emitting device comprising:
at least one single-die semiconductor light-emitting device coupleable with a power supply to emit visible light, the light-emitting device comprising rare-earth doped group IV nanocrystal material (REGIVN); and
at least one layer of group II-VI or III-V nanocrystals arranged to receive light emitted by the at least one layer containing rare earth doped group IV nanocrystal material as a pump light source, the group II-VI or III-V nanocrystals fluorescing at a plurality of wavelengths when energized by the pump light source;
wherein primary radiation produced by the at least one layer containing REDGIVN is down-converted by the at least one layer of group II-VI or III-V nanocrystals to at least two distinct and separable regions of red and/or green and/or blue light, with said at least two regions of red and/or green and/or blue light mixing to produce a different colored output.

35. A light emitting device comprising:
at least one single-die semiconductor light-emitting device coupleable with a power supply to emit visible light, the light-emitting device comprising rare-earth doped group IV nanocrystal material (REGIVN); and
at least one layer of group II-VI or III-V nanocrystals arranged to receive light emitted by the at least one layer containing rare earth doped group IV nanocrystal material as a pump light source, the group II-VI or III-V nanocrystals fluorescing at a plurality of wavelengths when energized by the pump light source;
wherein primary radiation produced by the at least one layer containing REDGIVN is down-converted by the at least one layer of group II or VI nanocrystals to between 2 and 10 distinct and separable regions of white light and light of the color hue red, green or blue light.

* * * * *